United States Patent
Iwasa et al.

(10) Patent No.: US 8,848,331 B2
(45) Date of Patent: Sep. 30, 2014

(54) PROTECTION DEVICE, COMPLEMENTARY PROTECTION DEVICE, SIGNAL OUTPUT DEVICE, LATCH-UP PREVENTING METHOD, AND COMPUTER-READABLE MEDIUM

(75) Inventors: Yosuke Iwasa, Miyazaki (JP); Atsuhiro Kai, Miyazaki (JP); Osamu Kuroki, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 341 days.

(21) Appl. No.: 13/234,192

(22) Filed: Sep. 16, 2011

(65) Prior Publication Data
US 2012/0069483 A1 Mar. 22, 2012

(30) Foreign Application Priority Data

Sep. 21, 2010 (JP) ................................. 2010-211321

(51) Int. Cl.
*H02H 3/22* (2006.01)
*H03F 3/30* (2006.01)
*H02H 9/00* (2006.01)
*H03F 1/52* (2006.01)

(52) U.S. Cl.
CPC .............. *H03F 1/523* (2013.01); *H03F 3/3022* (2013.01)
USPC ............................... 361/111; 361/56; 330/298

(58) Field of Classification Search
USPC ..................................... 361/111, 56; 330/298
See application file for complete search history.

(56) References Cited

U.S. PATENT DOCUMENTS

| 4,947,063 | A  | * | 8/1990  | O'Shaughnessy et al. ... 327/384 |
| 6,013,935 | A  | * | 1/2000  | Shie .............................. 257/469 |
| 7,253,596 | B2 | * | 8/2007  | Yamamoto et al. ........... 323/281 |
| 7,633,731 | B1 | * | 12/2009 | So ..................................... 361/56 |
| 2008/0170345 | A1 | * | 7/2008  | Tanabe ............................ 361/79 |
| 2011/0128277 | A1 | * | 6/2011  | Murakami ..................... 345/212 |

FOREIGN PATENT DOCUMENTS

| JP | 03-159408 A    | 7/1991  |
| JP | H08-331757 A   | 12/1996 |
| JP | 2002353795 A   | 12/2002 |
| JP | 2004072277 A   | 3/2004  |
| JP | 2005-252494 A  | 9/2005  |
| JP | 2006166142 A   | 6/2006  |

OTHER PUBLICATIONS

Japanese Office Action dated Mar. 11, 2014.

* cited by examiner

*Primary Examiner* — Jared Fureman
*Assistant Examiner* — Lucy Thomas
(74) *Attorney, Agent, or Firm* — Rabin & Berdo, P.C.

(57) ABSTRACT

A protection device includes: a serial element unit that includes a first switching element and a resistive element, one end being connected to a control terminal of a protection-target switching element, the other end being connected to a first voltage line, the protection-target switching element including a first terminal connected to the first voltage line, a second terminal connected to a second voltage line and an inductor unit, and the control terminal, the protection-target switching element switching a conduction state at the normal time to a non-conduction state between the first terminal and the second terminal when an off-voltage is applied to the control terminal; a capacitance provided at the protection-target switching element and has a predetermined capacitance value; and a controller that performs control such that the first switching element is in a conduction state if the protection-target switching element is put into a non-conduction state.

18 Claims, 12 Drawing Sheets

Related Art

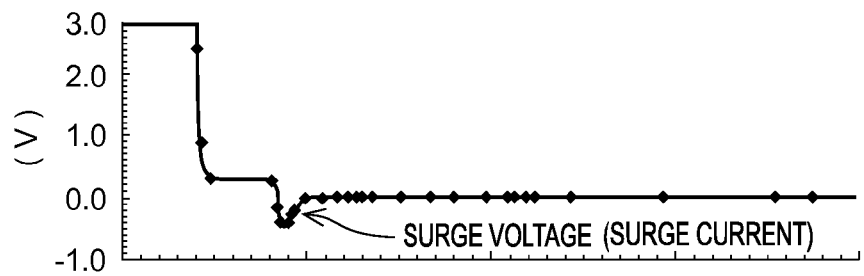
FIG.10A - Related Art
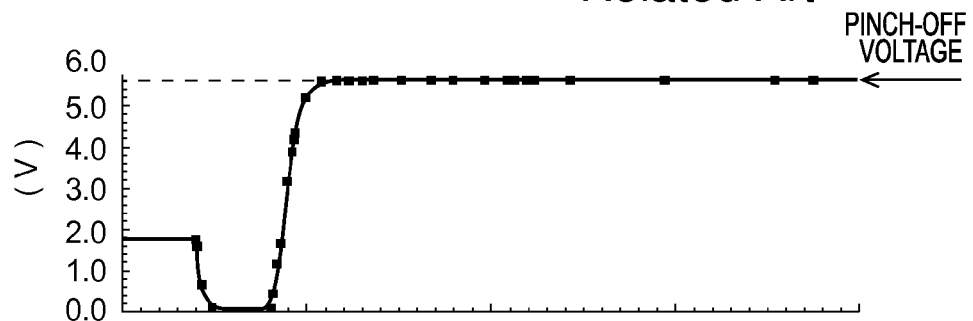
FIG.10B - Related Art
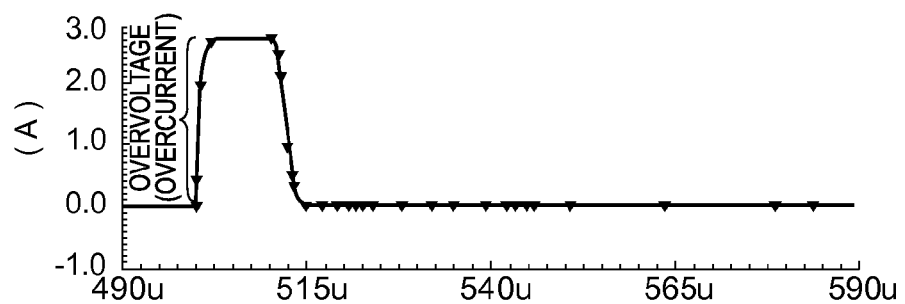
FIG.10C - Related Art

PROTECTION DEVICE, COMPLEMENTARY PROTECTION DEVICE, SIGNAL OUTPUT DEVICE, LATCH-UP PREVENTING METHOD, AND COMPUTER-READABLE MEDIUM

CROSS-REFERENCE TO RELATED APPLICATIONS

This application claims priority under 35 USC 119 from Japanese Patent Application No. 2010-211321 filed on Sept. 21, 2010, the disclosure of which is incorporated by reference herein.

BACKGROUND OF THE INVENTION

1. Field of the Invention

The invention relates to a protection device, a complementary protection device, a signal output device, a latch-up preventing method, and a computer-readable medium in which a program is stored, and particularly to a protection device, a complementary protection device, a signal output device, and a latch-up preventing method for preventing latch-up of a switching element of a protection target, and a computer-readable medium in which a program is stored.

2. Description of the Related Art

Conventionally, for example, if an overcurrent is output from an output stage of an amplifier that is used while connected to a speaker, the overcurrent is detected by an overcurrent detecting circuit to output a detecting signal to a control circuit, and the amplifier is powered down to prevent a switching element (the protection-target switching element) constituting the output stage from being broken down by the overcurrent (for example, see Japanese Patent Application Laid-Open No. 2005-252494 and No. 03-159408). As used herein, the "power-down" means that an output from the amplifier is stopped, and specifically that driving of the switching element of the protection target is stopped. Hereinafter, a time when the overcurrent is not generated is referred to as a "normal time".

FIG. 9 illustrates an example of an amplifier 100 of the related art that can be powered down. As illustrated in FIG. 9, the amplifier 100 includes a differential stage 102, an offset stage 104, and an output stage 105. The output stage 105 includes P-channel type MOS field effect transistors (hereinafter referred to as "PMOS transistors") 106 and 108, N-channel type MOS field effect transistors (hereinafter referred to as "NMOS transistors") 110 and 112, and an output terminal 114. One end of a coil 116 is connected to the output terminal 114. The other end of the coil 116 is grounded. At this point, by way of example, the coil 116 having an inductor component of 500 nH is connected to the output terminal 114.

The differential stage 102 includes a positive input terminal 102A to which a positive input signal is input, a negative input terminal 102B to which a negative input signal is input, a power supply terminal 102C that is connected to a power supply wire VDD through which a driving positive electrode voltage is provided to the amplifier 100, and a ground terminal 102D that is connected to a ground wire GND through which a ground voltage is provided to the amplifier 100. The differential stage 102 amplifies a difference voltage signal indicating a difference voltage between the positive input signal input to the positive input terminal 102A and the negative input signal input to the negative input terminal 102B and outputs the amplified difference voltage signal to the subsequent offset stage 104.

The offset stage 104 is connected to the differential stage 102 such that the difference voltage signal is input to the offset stage 104, and the offset stage 104 generates and outputs a differential voltage in which an offset voltage component generated in the differential stage 102 is removed from the difference voltage signal. The offset stage 104 includes an output terminal 104A that is an output terminal in a negative output state at the normal time and outputs a positive-electrode differential signal obtained by removing the offset voltage component from the input difference voltage signal, an output terminal 104B that is an output terminal in a positive output state at the normal time and outputs a negative-electrode differential signal obtained by removing the offset voltage component from the input difference voltage signal, a power supply terminal 104C that is connected to the power supply wire VDD, and a ground terminal 104D that is connected to the ground wire GND.

The PMOS transistor 106 is a target (the protection-target switching element) to be protected from a latch-up. The PMOS transistor 106 includes a gate terminal that is connected to the output terminal 104A, a source terminal that is connected to power supply wire VDD, and a drain terminal that is connected to the output terminal 114. The PMOS transistor 106 is configured such that a conduction state at the normal time becomes a non-conduction state between the source terminal and the drain terminal when an off-voltage (a voltage at which the non-conduction state is established between the source terminal and the drain terminal) is applied to the gate terminal.

The PMOS transistor 108 is a switching element that establishes the non-conduction state between the source terminal and the drain terminal of the PMOS transistor 106 when an overcurrent detecting circuit (not illustrated) detects the overcurrent in the amplifier 100. The PMOS transistor 108 includes a source terminal that is connected to the power supply wire VDD, a drain terminal that is connected to the gate terminal of the PMOS transistor 106, and a gate terminal. The gate terminal of the PMOS transistor 108 is connected to a control circuit (not illustrated) connected to the overcurrent detecting circuit, and the off-voltage is applied to the gate terminal at the normal time by the control circuit.

The NMOS transistor 110 is a second protection-target switching element, and includes a gate terminal that is connected to the output terminal 104B, a source terminal that is connected to the ground wire GND, and a drain terminal that is connected to the output terminal 114. The NMOS transistor 110 is configured such that the conduction state at the normal time becomes the non-conduction state between the source terminal and the drain terminal when the off-voltage is applied to the gate terminal.

The NMOS transistor 112 establishes the non-conduction state between the source terminal and the drain terminal of the NMOS transistor 110 when the overcurrent detecting circuit detects the overcurrent in the amplifier 100. The NMOS transistor 112 includes a source terminal that is connected to the power supply wire VDD, a drain terminal that is connected to the gate terminal of the NMOS transistor 110, and a gate terminal. The gate terminal of the NMOS transistor 112 is connected to the control circuit, and the off-voltage is applied to the gate terminal at the normal time by the control circuit.

In the amplifier 100 having the above-described configuration, when the overcurrent detecting circuit detects the overcurrent, the control circuit controls the PMOS transistor 108 and the NMOS transistor 112 such that the non-conduction state is established between the source terminal and the drain terminal of each of the PMOS transistor 106 and the NMOS transistor 110. That is, the voltage applied to the gate terminal of each of the PMOS transistor 108 and the NMOS transistor 112 is controlled such that the conduction state is established between the source terminal and the drain terminal of each of the PMOS transistor 108 and the NMOS transistor 112. Therefore, the off-voltage is applied to the gate terminal of each of the PMOS transistor 108 and the NMOS transistor 110 to cut off the overcurrent.

Because the off-voltage is rapidly applied to the gate terminal of each of the PMOS transistor 106 and the NMOS transistor 110 (for an example of the change with time of the voltage applied to the gate terminal of the PMOS transistor 106, see FIG. 10B), the conduction state is rapidly changed to the non-conduction state between the source terminal and the drain terminal of each of the PMOS transistor 106 and the NMOS transistor 110, and the state in which the overcurrent is passed is rapidly changed to the state in which the current is not passed at the output terminal 114 as illustrated in FIG. 10C. As a result, a surge current is generated at the output terminal 114, the output voltage of the amplifier 100 temporarily becomes lower than the ground voltage due to the generated surge current as illustrated in FIG. 10A, and therefore, the latch-up is generated in the PMOS transistor 106 and the NMOS transistor 110 to break down the PMOS transistor 106 and the NMOS transistor 110.

SUMMARY OF THE INVENTION

The present invention has been made in view of the above circumstances and provides a protection device, a complementary protection device, a signal output device, a latch-up preventing method, and a computer-readable medium in which a program is stored to prevent a latch-up of a protection-target switching element.

According to a first aspect of the invention, there is provided a protection device including: a serial element unit that includes a first switching element in a non-conduction state at a normal time and a resistive element series-connected to the first switching element, one end of the serial element unit being connected to a control terminal of a protection-target switching element, the other end of the serial element unit being connected to a first voltage line, the protection-target switching element including a first terminal connected to the first voltage line to which a first voltage is applied, a second terminal connected to a second voltage line to which a second voltage different from the first voltage is applied and an inductor unit having an inductor component, and the control terminal, the protection-target switching element switching a conduction state at the normal time to a non-conduction state between the first terminal and the second terminal that are in a non-conduction state at a normal time when an off-voltage is applied to the control terminal; a capacitance that is provided at the protection-target switching element and has a predetermined capacitance value; and a controller that performs control such that the first switching element is in a conduction state if the protection-target switching element is put into a non-conduction state.

In the protection device of the first aspect, the serial element unit includes the first switching element which is in the non-conduction state at the normal time and the resistive element series-connected to the first switching element, one end of the serial element unit is connected to the control terminal of the protection-target switching element, the other end is connected to the first voltage line, the protection-target switching element includes the first terminal connected to the first voltage line to which the first voltage is applied, the second terminal connected to the second voltage line to which the second voltage different from the first voltage is applied and the inductor unit having the inductor component, and the control terminal, and the protection-target switching element switches the conduction state at the normal time to the non-conduction state between the first terminal and the second terminal when the off-voltage is applied to the control terminal, and the control is performed such that the first switching element is put into the conduction state if the protection-target switching element is put into the non-conduction state. Therefore, the latch-up of the protection-target switching element can be prevented.

According to a protection device of a second aspect, in the first aspect, the one end of the serial element unit may be connected to the control terminal through a second resistive element. Therefore, the transition of the protection-target switching element from the conduction state to the non-conduction state is further slowed, so that the latch-up of the protection-target switching element can more securely be prevented.

According to a protection device of a third aspect, in the second aspect, the protection device may further include a short-circuit/non-short-circuit switching unit that can switch between a short-circuit state in which a short circuit occurs between both ends of the second resistive element and a non-short-circuit state in which the short circuit does not occur between the both ends, wherein the controller may perform control such that the first switching element is in the conduction state and controls the short-circuit/non-short-circuit switching unit such that the short-circuit state is formed between the both ends of the second resistive element, if the protection-target switching element is put into the non-conduction state in a state in which a current having a current value equal to or higher than a first current value and lower than a second current value is passed through the protection-target switching element, and the controller may perform control such that the first switching element is in the conduction state and controls the short-circuit/non-short-circuit switching unit such that the non-short-circuit state is formed between the both ends of the second resistive element, if the protection-target switching element is put into the non-conduction state in a state in which a current having a current value equal to or higher than the second current value is passed through the protection-target switching element. Therefore, the latch-up of the protection-target switching element can be prevented in a multistep manner according to a magnitude of the overcurrent.

According to a protection device of a fourth aspect, in any one of the first to third aspects, the protection device may further include a charging permission/prohibition switching unit that can switch between a charging state in which a capacitive load can be charged and a non-charging state in which the capacitive load cannot be charged, when the capacitance is the capacitive load, wherein the controller may control the charging permission/prohibition switching unit such that the capacitive load is in the non-charging state, if the protection-target switching element is put into the non-conduction state in a state in which a current having a current value equal to or higher than a first current value and lower than a second current value is passed through the protection-target switching element, and the controller may control the charging permission/prohibition switching unit such that the capacitive load is in the charging state, if the protection-target switching element is put into the non-conduction state in a state in which a current having a current value equal to or higher than the second current value is passed through the protection-target switching element. Therefore, the latch-up of the protection-target switching element can be prevented in a detailed multistep manner according to the magnitude of the overcurrent.

According to a protection device of a fifth aspect, in any one of the first to fourth aspects, the protection device may further include at least one second capacitive load that is parallel-connected to the capacitance. Therefore, the transition of the protection-target switching element from the conduction state to the non-conduction state is further slowed, so that the latch-up of the protection-target switching element can more securely be prevented.

According to a protection device of a sixth aspect, in the fifth aspect, the protection device may further include a second charging permission/prohibition switching unit that is provided at the at least one second capacitive load and that can switch the second capacitive load between the charging state and the non-charging state, wherein the controller may control the second charging permission/prohibition switching unit such that the second capacitive load in the charging state is increased according to an increase in current if the protection-target switching element is put into the non-conduction state in a state in which the current is passed through the protection-target switching element. Therefore, the latch-up of the protection-target switching element can be prevented in a moer detailed multistep manner according to the magnitude of the overcurrent.

According to a protection device of a seventh aspect, in any one of the first to sixth aspects, the first switching element may be an output transistor based on the premise that a gate capacitance C is 100 pF<C<300 pF, and a resistor satisfying X μm<RC<(60000/X) μm is inserted in a signal path of a power-down signal to control to put the first switching element into the conduction state, wherein X μm is driving performance of the output transistor. Therefore, the latch-up of the protection-target switching element can more accurately be prevented.

According to an eighth aspect, there is provided a protection device including: a serial element unit that includes a first switching element in a non-conduction state at a normal time and a resistive element series-connected to the first switching element, one end of the first switching element side of the serial element unit being connected to a control terminal of a protection-target switching element, the other end of the resistive element side of the serial element unit being connected to a first voltage line, the protection-target switching element including a first terminal connected to the first voltage line to which a first voltage is applied, a second terminal connected to a second voltage line to which a second voltage different from the first voltage is applied and an inductor unit having an inductor component, and the control terminal, the protection-target switching element switching a conduction state at the normal time to a non-conduction state between the first terminal and the second terminal that are in a non-conduction state at the normal time when an off-voltage is applied to the control terminal; a second switching element that is in a non-conduction state at the normal time, one end of the second switching element being connected to a connection portion of the first switching element and the resistive element, the other end of the second switching element being connected to the first voltage line; and a controller that performs control such that the first switching element is in a conduction state and the second switching element is in a conduction state if the protection-target switching element is put into a non-conduction state in a state in which an overcurrent is not passed through the protection-target switching element, and the controller performs control such that the first switching element is in the conduction state and the second switching element is in the non-conduction state if the protection-target switching element is put into the non-conduction state in a state in which the overcurrent is passed through the protection-target switching element.

In the protection device of the eighth aspect, the control is performed such that the first switching element and the second switching element are put into the conduction state if the protection-target switching element is put into the non-conduction state in a state in which the overcurrent is not passed through the protection-target switching element, and the control is performed such that the first switching element is put into the conduction state and the second switching element is put into the non-conduction state if the protection-target switching element is put into the non-conduction state in a state in which the overcurrent is passed through the protection-target switching element. Therefore, the latch-up of the protection-target switching element can be prevented, and generation of a popping noise can be suppressed.

According to a protection device of a ninth aspect, in the eighth aspect, the one end of the serial element unit may be connected to the control terminal through a second resistive element. Therefore, the transition of the protection-target switching element from the conduction state to the non-conduction state is further slowed, so that the latch-up of the protection-target switching element can more securely be prevented.

According to a protection device of a tenth aspect, in the ninth aspect, the protection device may further include a short-circuit/non-short-circuit switching unit that can switch between a short-circuit state in which a short circuit occurs between both ends of the second resistive element and a non-short-circuit state in which the short circuit does not occur between the both ends, wherein the controller may perform control such that the first switching element is in the conduction state and the second switching element is in the non-conduction state and the controller controls the short-circuit/non-short-circuit switching unit such that the short-circuit state is formed between both the ends of the second resistive element, if the protection-target switching element is put into the non-conduction state in a state in which the overcurrent having a current value equal to or higher than a first current value and lower than a second current value is passed through the protection-target switching element, and the controller may perform control such that the first switching element is in the conduction state and the second switching element is in the non-short-circuit state and the controller controls the short-circuit/non-short-circuit switching unit such that the non-short-circuit state is formed between the both the ends of the second resistive element, if the protection-target switching element is put into the non-conduction state in a state in which the overcurrent having a current value equal to or higher than the second current value is passed through the protection-target switching element. Therefore, the latch-up of the protection-target switching element can be prevented in a multistep manner according to the magnitude of the overcurrent.

According to a protection device of an eleventh aspect, in any one of the eighth to tenth aspects, the protection device may further include a capacitance having a predetermined capacitance value, the capacitance being included in the protection-target switching element. Therefore, the transition of the protection-target switching element from the conduction state to the non-conduction state is further slowed, so that the latch-up of the protection-target switching element can more securely be prevented.

According to a protection device of a twelfth aspect, in the eleventh aspect, the protection device may further include a charging permission/prohibition switching unit that can switch between a charging state in which a capacitive load can be charged and a non-charging state in which the capacitive load cannot be charged when the capacitance is the capacitive load, wherein the controller may control the charging permission/prohibition switching unit such that the capacitive load is in the non-charging state, if the protection-target switching element is put into the non-conduction state in a state in which the overcurrent having a current value equal to or higher than a first current value and lower than a second current value is passed through the protection-target switching element, and the controller may control the charging permission/prohibition switching unit such that the capacitive load is in the charging state, if the protection-target switching element is put into the non-conduction state in a state in which the overcurrent having a current value equal to or higher than the second current value is passed through the protection-target switching element. Therefore, the latch-up of the protection-target switching element can be prevented in a more detailed multistep manner according to the magnitude of the overcurrent.

According to a protection device of a thirteenth aspect, in the eleventh or twelfth aspect, the protection device may further include at least one second capacitive load that is parallel-connected to the capacitance. Therefore, the transition of the protection-target switching element from the conduction state to the non-conduction state is further slowed, so that the latch-up of the protection-target switching element can more securely be prevented.

According to a protection device of a fourteenth aspect, in the thirteenth aspect, the protection device may further include a second charging permission/prohibition switching unit that is provided at the at least one second capacitive load and that can switch the second capacitive load between the charging state and the non-charging state, wherein the controller may control the second charging permission/prohibition switching unit such that the second capacitive load in the charging state is increased according to an increase in the overcurrent if the protection-target switching element is put into the non-conduction state in a state in which the overcurrent is passed through the protection-target switching element. Therefore, the latch-up of the protection-target switching element can be prevented in a more detailed multistep manner according to the magnitude of the overcurrent.

According to a fifteenth aspect of the invention, there is provided a complementary protection device including: the protection device according to any one of the first to seventh aspects; a second serial element unit that includes a third switching element in a non-conduction state at the normal time and a third resistive element series-connected to the third switching element, one end of the second serial element unit being connected to a corresponding control terminal of a second protection-target switching element, the other end of the second serial element unit being connected to a second voltage line, the second protection-target switching element including a corresponding first terminal that corresponds to the first terminal and is connected to the second voltage line, a corresponding second terminal that corresponds to the second terminal and is connected to the second terminal, and the corresponding control terminal corresponding to the control terminal, the second protection-target switching element switching a conduction state at the normal time to a non-conduction state between the corresponding first terminal and the corresponding second terminal when the off-voltage is applied to the corresponding control terminal; and a second capacitance that is provided at the second protection-target switching element and has a predetermined capacitance value, wherein the controller performs control such that the third switching element is in a conduction state if the second protection-target switching element is put into a non-conduction state.

The complementary protection device of the fifteenth aspect includes the protection device according to any one of the first to seventh aspects; the second serial element unit that includes the third switching element which is in the non-conduction state at the normal time and the third resistive element series-connected to the third switching element, wherein one end of the second serial element unit is connected to the corresponding control terminal of the second protection-target switching element, the other end is connected to the second voltage line, the second protection-target switching element includes the corresponding first terminal that corresponds to the first terminal and is connected to the second voltage line, the corresponding second terminal that corresponds to the second terminal and is connected to the second terminal, and the corresponding control terminal corresponding to the control terminal, the second protection-target switching element switches the conduction state at the normal time to the non-conduction state between the corresponding first terminal and the corresponding second terminal when the off-voltage is applied to the corresponding control terminal; and the second capacitance that is provided at the second protection-target switching element and has the predetermined capacitance value, and, further, the control is performed such that the third switching element is put into the conduction state if the second protection-target switching element is put into the non-conduction state. Therefore, the latch-up of the protection-target switching element can be prevented.

According to a complementary protection device of a sixteenth aspect, in the fifteenth aspect, the one end of the second serial element unit may be connected to the corresponding control terminal through a fourth resistive element. Therefore, the transition of the second protection-target switching element from the conduction state to the non-conduction state is further slowed, so that the latch-up of the second protection-target switching element can more securely be prevented.

According to a complementary protection device of a seventeenth aspect, in the sixteenth aspect, the complementary protection device may further include a second short-circuit/non-short-circuit switching unit that can switch between a short-circuit state in which a short circuit occurs between both ends of the fourth resistive element and a non-short-circuit state in which the short circuit does not occur between the both ends, wherein the controller may perform control such that the third switching element is in the conduction state and controls the second short-circuit/non-short-circuit switching unit such that the fourth resistive element is in the short-circuit state, if the corresponding first terminal and the corresponding second terminal of the second protection-target switching element are put into the non-conduction state in a state in which a current having a current value equal to or higher than a first current value and lower than a second current value is passed through the second protection-target switching element, and the controller may perform control such that the third switching element is in the conduction state and controls the second short-circuit/non-short-circuit switching unit such that the fourth resistive element is in the non-short-circuit state , if the second protection-target switching element is put into the non-conduction state in a state in which a current having a current value equal to or higher than the second current value is passed through the second protection-target switching element. Therefore, the latch-up of the second protection-target switching element can be prevented in a multistep manner according to the magnitude of the overcurrent.

According to a complementary protection device of an eighteenth aspect, in any one of the fifteenth to seventeenth aspects, the complementary protection device may further include a third charging permission/prohibition switching unit that can switch between a charging state in which a third capacitive load can be charged and a non-charging state in which the third capacitive load cannot be charged when the second capacitance is the third capacitive load, wherein the controller may control the third charging permission/prohibition switching unit such that the third capacitive load is in the non-charging state, if the second protection-target switching element is put into the non-conduction state in a state in which a current having a current value equal to or higher than a first current value and lower than a second current value is passed through the second protection-target switching element, and the controller may control the third charging permission/prohibition switching unit such that the third capacitive load is in the charging state, if the second protection-target switching element is put into the non-conduction state in a state in which a current having a current value equal to or higher than the second current value is passed through the second protection-target switching element. Therefore, the latch-up of the second protection-target switching element can be prevented in a more detailed multistep manner according to the magnitude of the overcurrent.

According to a complementary protection device of a nineteenth aspect, in any one of the fifteenth to eighteenth aspects, the complementary protection device may further include at least one fourth capacitive load that is parallel-connected to the second capacitance. Therefore, the transition of the second protection-target switching element from the conduction state to the non-conduction state is further slowed, so that the latch-up of the second protection-target switching element can more securely be prevented.

According to a complementary protection device of a twentieth aspect, in the nineteenth aspect, the complementary protection device may further include a fourth charging permission/prohibition switching unit that is provided at the at least one fourth capacitive load and that can switch the fourth capacitive load between the charging state and the non-charging state, wherein the controller may control the fourth charging permission/prohibition switching unit such that the fourth capacitive load in the charging state is increased according to an increase in current if the second protection-target switching element is put into the non-conduction state in a state in which the current is passed through the second protection-target switching element. Therefore, the latch-up of the second protection-target switching element can be prevented in a more detailed multistep manner according to the magnitude of the overcurrent.

According to a complementary protection device of a twenty-first aspect, in any one of the fifteenth to twentieth aspects, the third switching element may be an output transistor based on the premise that a gate capacitance C is 100 pF<C<300 pF, and a resistor satisfying X μm<RC<(60000/X) μm is inserted in a signal path of a power-down signal to control to put the third switching element into the conduction state, wherein X μm is driving performance of the output transistor. Therefore, the latch-up of the second protection-target switching element can more accurately be prevented.

According to a twenty-second aspect of the invention, there is provided a complementary protection device including: the protection device according to any one of the eighth to fourteenth aspects; a second serial element unit that includes a third switching element in a non-conduction state at the normal time and a third resistive element series-connected to the third switching element, one end of the third switching element side of the second serial element being connected to a corresponding control terminal of a second protection-target switching element, the other end of the third resistive element side of the second serial element being connected to a second voltage line, the second protection-target switching element including a corresponding first terminal that corresponds to the first terminal and is connected to the second voltage line, a corresponding second terminal that corresponds to the second terminal and is connected to the second terminal, and the corresponding control terminal corresponding to the control terminal, the second protection-target switching element switching a conduction state at the normal time to a non-conduction state between the corresponding first terminal and the corresponding second terminal when the off-voltage is applied to the corresponding control terminal; and a fourth switching element that is in a non-conduction state at the normal time, one end of the fourth switching element being connected to a connection portion of the third switching element and the third resistive element, and the other end of the fourth switching element being connected to the second voltage line, wherein the controller performs control such that the third switching element is in a conduction state and the fourth switching element is in a conduction state if the second protection-target switching element is put into the non-conduction state in a state in which an overcurrent is not passed through the second protection-target switching element, and the controller performs control such that the third switching element is in the conduction state and the fourth switching element is in the non-conduction state if the second protection-target switching element is put into the non-conduction state in a state in which the overcurrent is passed through the second protection-target switching element.

In the complementary protection device of the twenty-second aspect, the controller performs control to put the third switching element and the fourth switching element into the conduction state if the second protection-target switching element is put into the non-conduction state in a state in which the overcurrent is not passed through the second protection-target switching element, and the controller puts the third switching element into the conduction state and puts the fourth switching element into the non-conduction state if the second protection-target switching element is put into the non-conduction state in a state in which the overcurrent is passed through the second protection-target switching element. Therefore, the latch-up can be prevented in the protection-target switching element and the second protection-target switching element, which constitute the complementary switching element, and the generation of a popping noise can be suppressed.

According to a complementary protection device of a twenty-third aspect, in the twenty-second aspect, the one end of the second serial element unit may be connected to the corresponding control terminal through a fourth resistive element. Therefore, the transition of the second protection-target switching element from the conduction state to the non-conduction state is further slowed, so that the latch-up of the second protection-target switching element can more securely be prevented.

According to a complementary protection device of a twenty-fourth aspect, in the twenty-third aspect, the complementary protection device may further include a second short-circuit/non-short-circuit switching unit that can switch between a short-circuit state in which a short circuit occurs between both ends of the fourth resistive element and a nonshort-circuit state in which the short circuit does not occur between the both ends, wherein the controller may perform control such that the third switching element is in the conduction state and the fourth switching element is in the non-conduction state and the controller controls the second short-circuit/non-short-circuit switching unit such that the fourth resistive element is in the short-circuit state, if the second protection-target switching element is put into the non-conduction state between the corresponding first terminal and the corresponding second terminal in a state in which the overcurrent having a current value equal to or higher than a first current value and lower than a second current value is passed through the protection-target switching element, and the controller may perform control such that the third switching element is in the conduction state and the fourth switching element is in the non-conduction state and the controller controls the second short-circuit/non-short-circuit switching unit such that the fourth resistive element is in the non-short-circuit state, if the second protection-target switching element is put into the non-conduction state in a state in which the overcurrent having a current value equal to or higher than the second current value is passed through the second protection-target switching element. Therefore, the latch-up of the second protection-target switching element can be prevented in a multistep manner according to the magnitude of the overcurrent.

According to a complementary protection device of a twenty-fifth aspect, in any one of the twenty-second to twenty-fourth aspects, the complementary protection device may further include a second capacitance having a predetermined capacitance value, the second capacitance being included at the second protection-target switching element. Therefore, the transition of the second protection-target switching element from the conduction state to the non-conduction state is further slowed, so that the latch-up of the second protection-target switching element can more securely be prevented.

According to a complementary protection device of a twenty-sixth aspect, in the twenty-fifth aspect, the complementary protection device may further include a third charging permission/prohibition switching unit that can switch a third capacitive load between a charging state and a non-charging state when the second capacitance is the third capacitive load, wherein the controller may control the third charging permission/prohibition switching unit such that the third capacitive load is in the non-charging state, if the second protection-target switching element is put into the non-conduction state in a state in which the overcurrent having a current value equal to or higher than a first current value and lower than a second current value is passed through the second protection-target switching element, and the controller may control the third charging permission/prohibition switching unit such that the third capacitive load is in the charging state, if the second protection-target switching element is put into the non-conduction state in a state in which the overcurrent having a current value equal to or higher than the second current value is passed through the second protection-target switching element. Therefore, the latch-up of the second protection-target switching element can be prevented in a more detailed multistep manner according to the magnitude of the overcurrent.

According to a complementary protection device of a twenty-seventh aspect, in the twenty-fifth or twenty-sixth aspect, the complementary protection device may further include at least one fourth capacitive load that is parallel-connected to the second capacitance. Therefore, the transition of the second protection-target switching element from the conduction state to the non-conduction state is further slowed, so that the latch-up of the second protection-target switching element can more securely be prevented.

According to a complementary protection device of a twenty-eighth aspect, in the twenty-seventh aspect, the complementary protection device may further include a fourth charging permission/prohibition switching unit that is provided at the at least one fourth capacitive load and that can switch the fourth capacitive load between the charging state and the non-charging state, wherein the controller may control the fourth charging permission/prohibition switching unit such that the fourth capacitive load in the charging state is increased according to an increase in overcurrent if the second protection-target switching element is put into the non-conduction state in a state in which the overcurrent is passed through the second protection-target switching element. Therefore, the latch-up of the second protection-target switching element can be prevented in a more detailed multistep manner according to the magnitude of the overcurrent.

According to a complementary protection device of a twenty-ninth aspect, in any one of the twenty-second to twenty-eighth aspects, each switching element which constitutes a switching element group selected from a first switching element group including the protection-target switching element, the first switching element, and the second switching element or the other switching element group including the second protection-target switching element, the third switching element, and the fourth switching element may include an N-type field effect transistor, and each switching element which constitutes the other switching element group selected from the first switching element group or the second switching element group may include a P-type field effect transistor. Therefore, the latch-up can be prevented in the protection-target switching element and the second protection-target switching element, which constitute the complementary switching element, and the generation of a popping noise can be suppressed.

According to a thirtieth aspect of the invention, there is provided a signal output device including: the complementary protection device according to any one of the fifteenth to twenty-ninth aspects; a voltage applying unit that applies a voltage to the control terminal to drive the protection-target switching element and applies a voltage to the corresponding control terminal to drive the second protection-target switching element; and a signal output unit that outputs a signal corresponding to the voltage, applied by the voltage applying unit, through the inductor unit.

The signal output device of the thirtieth aspect includes the complementary protection device according to any one of the fifteenth to twenty-ninth aspects, the voltage applying unit applies the voltage to the corresponding control terminal to drive the second protection-target switching element and applies the voltage to the control terminal to drive the protection-target switching element, and the signal output unit outputs the signal corresponding to the voltage, applied by the voltage applying unit, through the inductor unit.

Accordingly, the signal output device of the thirtieth aspect is operated similarly to the complementary protection device according to any one of the fifteenth to twenty-ninth aspects, so that the same effects as thereof the complementary protection device according to any one of the fifteenth to twenty-ninth aspects can be obtained.

According to a thirty-first aspect of the invention, there is provided a latch-up preventing method for the protection device according to any one of the eighth to fourteenth aspects, including: putting the first switching element and the second switching element into the conduction state, if the protection-target switching element is put into the non-conduction state in a state in which the overcurrent is not passed through the protection-target switching element; and putting the first switching element into the conduction state and putting the second switching element into the non-conduction state, if the protection-target switching element is put into the non-conduction state in a state in which the overcurrent is passed through the protection-target switching element.

Accordingly, the latch-up preventing method of the thirty-first aspect is operated similarly to the protection device according to any one of the eighth to fourteenth aspects, so that the same effects as those of the protection device according to the first aspect can be obtained.

According to a thirty-second aspect of the invention, there is provided a latch-up preventing method for the complementary protection device according to any one of the twenty-second to thirteenth aspects, including: putting the third switching element in the conduction state and putting the fourth switching element in the conduction state, if the second protection-target switching element is put into the non-conduction state in a state in which the overcurrent is not passed through the second protection-target switching element; and putting the third switching element in the conduction state and putting the fourth switching element in the non-conduction state, if the second protection-target switching element is put into the non-conduction state in a state in which the overcurrent is passed through the second protection-target switching element.

Accordingly, the latch-up preventing method of the thirty-second aspect is operated similarly to the complementary protection device according to any one of the twenty-second to twenty-ninth aspects, so that the same effects as those of the complementary protection device according to any one of the twenty-second to twenty-ninth aspects can be obtained.

According to a thirty-third aspect of the invention, there is provided a computer-readable medium in which a program causing a computer to execute processing is stored, the processing including: performing control such that a first switching element is in a conduction state and a second switching element is in a conduction state, if a protection-target switching element is put into a non-conduction state in a state in which an overcurrent is not passed through the protection-target switching element, the protection-target switching element including a first terminal connected to a first voltage line to which a first voltage is applied, a second terminal connected to a second voltage line to which a second voltage different from the first voltage is applied and an inductor unit having an inductor component, and a control terminal, the protection-target switching element switching a conduction state at a normal time to a non-conduction state between the first terminal and the second terminal when an off-voltage is applied to the control terminal, the first switching element which is in a non-conduction state at the normal time and a resistive element series-connected to the first switching element being included in a serial element unit, one end of the first switching element side of the serial element unit being connected to the control terminal of the protection-target switching element, the other end of the resistive element side of the serial element unit being connected to the first voltage line, the second switching element being in a non-conduction state at the normal time, one end of the second switching element being connected to a connection portion of the first switching element and the resistive element, and the other end of the second switching element being connected to the first voltage line; and performing control such that the first switching element is in a conduction state and the second switching element is in the non-conduction state if the protection-target switching element is put into the non-conduction state in a state in which the overcurrent is passed through the protection-target switching element.

Accordingly, the program stored in the computer-readable medium according to the thirty-third aspect is operated similarly to the protection device according to the eighth aspect, so that the same effects as those of the protection device according to the eighth aspect can be obtained.

According to a thirty-fourth aspect of the invention, there is provided a computer-readable medium in which a program causing a computer to execute processing is stored, the processing including: performing control such that a first switching element is in a conduction state and a second switching element is in a conduction state if a protection-target switching element is put into a non-conduction state in a state in which an overcurrent is not passed through the protection-target switching element, the protection-target switching element including a first terminal connected to a first voltage line to which a first voltage is applied, a second terminal connected to a second voltage line to which a second voltage different from the first voltage is applied and an inductor unit having an inductor component, and a control terminal, the protection-target switching element switching a conduction state at a normal time to the non-conduction state between the first terminal and the second terminal when an off-voltage is applied to the control terminal, the first switching element which is in a non-conduction state at the normal time and a resistive element series-connected to the first switching element being included in a serial element unit, one end of the first switching element side of the serial element unit being connected to the control terminal of the protection-target switching element, the other end of the resistive element side of the serial element unit being connected to the first voltage line, the second switching element being in a non-conduction state at the normal time, one end of the second switching element being connected to a connection portion of the first switching element and the resistive element, and the other end of the second switching element being connected to the first voltage line; performing control such that the first switching element is in a conduction state and the second switching element is in the non-conduction state if the protection-target switching element is put into the non-conduction state in a state in which the overcurrent is passed through the protection-target switching element; and performing control such that a third switching element is in a conduction state and a fourth switching element in a conduction state if a second protection-target switching element is put into the non-conduction state in a state in which the overcurrent is not passed through the second protection-target switching element, the second protection-target switching element including a corresponding first terminal that corresponds to the first terminal and that is connected to the second voltage line, a corresponding second terminal that corresponds to the second terminal and that is connected to the second terminal, and a corresponding control terminal corresponding to the control terminal, the second protection-target switching element switching a conduction state at the normal time to a non-conduction state between the corresponding first terminal and the corresponding second terminal when the off-voltage is applied to the corresponding control terminal, the third switching element which is in a non-conduction state at the normal time and a third resistive element series-connected to the third switching element being included in a second serial element unit, one end of the third switching element side of the second serial element unit being connected to the corresponding control terminal of the second protection-target switching element, the other end of the third resistive element side of the second serial element unit being connected to the second voltage line, the fourth switching element being in a non-conduction state at the normal time, one end of the fourth switching element being connected to a connection portion of the third switching element and the third resistive element, and the other end of the fourth switching element being connected to the second voltage line; and performing control such that the third switching element is in a conduction state and the fourth switching element in the non-conduction state if the second protection-target switching element is put into the non-conduction state in a state in which the overcurrent is passed through the second protection-target switching element.

Accordingly, the program stored in the computer-readable medium according to the thirty-fourth aspect is operated similarly to the protection device according to the twenty-second aspect, so that the same effects as those of the complementary protection device according to the twenty-second aspect can be obtained.

According to the invention, the latch-up of the protection-target switching element can be prevented.

BRIEF DESCRIPTION OF THE DRAWINGS

Preferred embodiments of the present invention will be described in detail based on the following figures, wherein:

FIG. 2A illustrates the change with time of the voltage value at an output terminal of the amplifier, FIG. 2B illustrates the change with time of the voltage value applied to a gate terminal of a protection-target PMOS transistor, and FIG. 2C illustrates the change with time of the current value of an overcurrent passed through the amplifier;

FIGS. 10A to 10C are graphs illustrating examples of a change with time of a voltage value or a current value during power-down of the amplifier of FIG. 9, FIG. 10A illustrates the change with time of the voltage value at an output terminal of the amplifier, FIG. 10B illustrates the change with time of the voltage value applied to a gate terminal of a protection-target PMOS transistor, and FIG. 10C illustrates the change with time of the current value of an overcurrent passed through the amplifier;

DETAILED DESCRIPTION OF THE INVENTION

Figure 9:
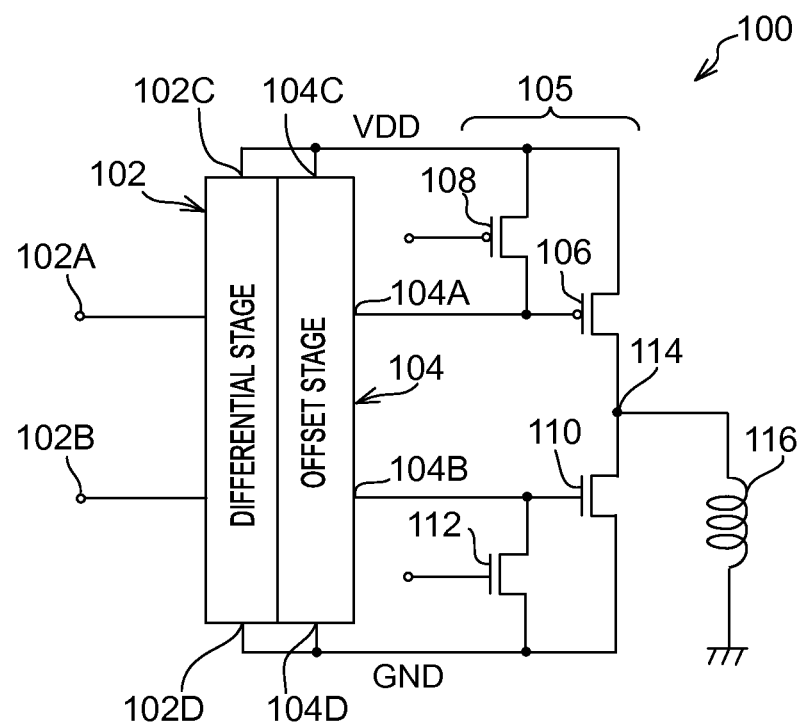
FIG. 9 is a view illustrating an example of a configuration of an amplifier of the related art.

Hereinafter, embodiments of the invention will be described in detail with reference to the drawings. In the following description, by way of example, the invention is applied to an amplifier that is used while connected to a speaker. The amplifier of the embodiment having a configuration similar to that of the amplifier 100 of FIG. 9 is designated by the identical numeral, and the description is omitted. In the following description, by way of example, both the PMOS transistor and the NMOS transistor constituting the complementary switching element (CMOS) are the protection target from the latch-up. In the case in which one of the PMOS transistor and the NMOS transistor is the protection target, the invention may be applied to at least the MOS transistor of the protection target.

In the amplifier 100 of FIG. 9, the latch-up is generated by the negative surge current when the overcurrent is stopped while the output from the output terminal 114 is short-circuited to the ground, and the latch-up is generated by the positive surge current when the overcurrent is stopped while the output from the output terminal 114 is short-circuited to the power supply. It is known that an inductance value of the coil 116 in which the latch-up is believed to be generated is about 350 nH at the overcurrent of 3 A. Accordingly, it is necessary take measures to prevent the latch-up when the coil 116 having the inductor component of about 350 nH or an inductor unit equivalent to the coil 116 is connected to the output terminal 114.

[First Embodiment]

Figure 1:
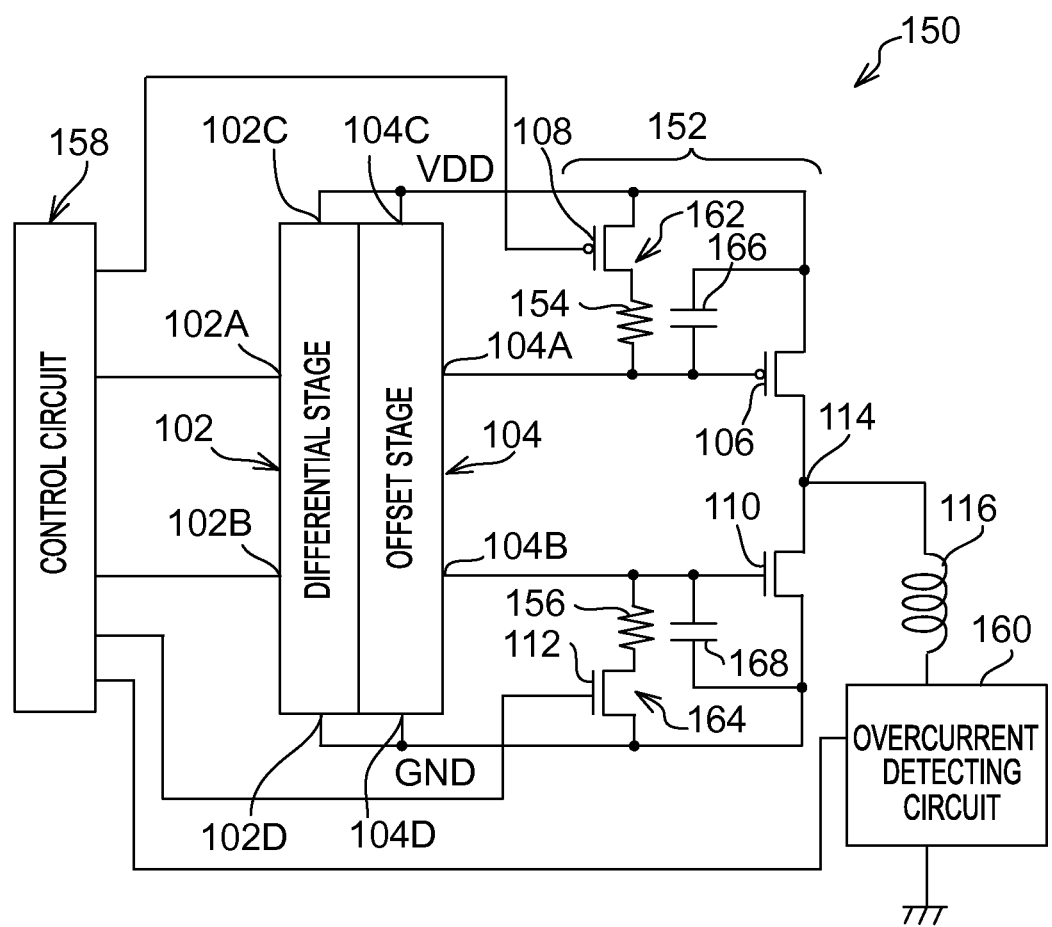
FIG. 1 is a view illustrating an example of a configuration of an amplifier according to a first embodiment of the invention.

FIG. 1 illustrates an example of an amplifier 150 according to a first embodiment of the invention, which can be powered down to prevent the generation of the latch-up of the PMOS transistor 106 and the NMOS transistor 110.

As illustrated in FIG. 1, the amplifier 150 differs from the amplifier 100 of FIG. 9 in that the output stage 105 is replaced with an output stage 152 and that a control circuit 158 and an overcurrent detecting circuit 160, which are omitted to be shown in FIG. 9, are provided. The output stage 152 differs from the output stage 105 of FIG. 9 in that serial element units 162 and 164 and gate capacitances 166 and 168 are provided. The amplifier 150 of the first embodiment includes an IC (Integrated Circuit), and the control circuit 158 that controls the whole of amplifier 150 is formed in the IC.

The serial element unit 162 includes the PMOS transistor 108 and a resistive element 154, and the resistive element 154 is series-connected to the PMOS transistor 108 such that the resistive element 154 and the PMOS transistor 108 connect the power supply wire VDD and the gate terminal of the PMOS transistor 106. In other words, the drain terminal of the PMOS transistor 108 is connected to the gate terminal of the PMOS transistor 106 through the resistive element 154.

The serial element unit 164 includes the NMOS transistor 112 and a resistive element 156, and the resistive element 156 is series-connected to the NMOS transistor 112 such that the resistive element 156 and the NMOS transistor 112 connect the ground wire GND and the gate terminal of the NMOS transistor 110. In other words, the drain terminal of the NMOS transistor 112 is connected to the gate terminal of the NMOS transistor 110 through the resistive element 156.

The gate capacitance 166 is a gate capacitance of the PMOS transistor 106. In FIG. 1, for the sake of easy understanding, the gate capacitance 166 is inserted between the gate terminal and the source terminal of the PMOS transistor 106.

The gate capacitance 168 is a gate capacitance of the NMOS transistor 110. In FIG. 1, for the sake of easy understanding, the gate capacitance 168 is inserted between the gate terminal and the source terminal of the NMOS transistor 110. In the first embodiment, the gate capacitances 166 and 168 are cited as a capacitive load by way of example. Alternatively, for example, a capacitor may be used instead of the gate capacitance. In this case, for example, one of electrodes of the capacitor that is used instead of the gate capacitance 162 is connected to the gate terminal of the PMOS transistor 106, the other electrode is connected to the source terminal of the PMOS transistor 106, one of electrodes of the capacitor that is used instead of the gate capacitance 168 is connected to the gate terminal of the NMOS transistor 110, and the other electrode is connected to the source terminal of the NMOS transistor 110. The capacitive load is not limited to the capacitor, but capacitive loads such as a variable-capacitance diode may be used. Thus, a capacitance having a predetermined capacitance value may be formed between the source terminal and the gate terminal of the MOS transistor. In the first embodiment, a capacitance value, which can prevent the latch-up of the PMOS transistor 106 and the NMOS transistor 110 and is previously fixed by a simulation or an experiment, is used as the "predetermined capacitance value".

The overcurrent detecting circuit 160 is inserted between the coil 116 and a ground line, and the overcurrent detecting circuit 160 outputs an overcurrent detecting signal when detecting the overcurrent. The overcurrent detecting circuit 160 is connected to the control circuit 158. Accordingly, the control circuit 158 can receive the overcurrent detecting signal output from the overcurrent detecting circuit 160.

On the other hand, the gate terminal of the PMOS transistor 108 is connected to the control circuit 158. The gate terminal of the NMOS transistor 112 is also connected to the control circuit 158. Accordingly, the control circuit 158 can apply the voltage to the gate terminal of each of the PMOS transistor 108 and the NMOS transistor 112 in order to switch between an on-state and an off-state, which are of a function as the switching element of each of the PMOS transistor 108 and the NMOS transistor 112.

An operation of the amplifier 150 of the first embodiment will be described below.

Figure 2A:
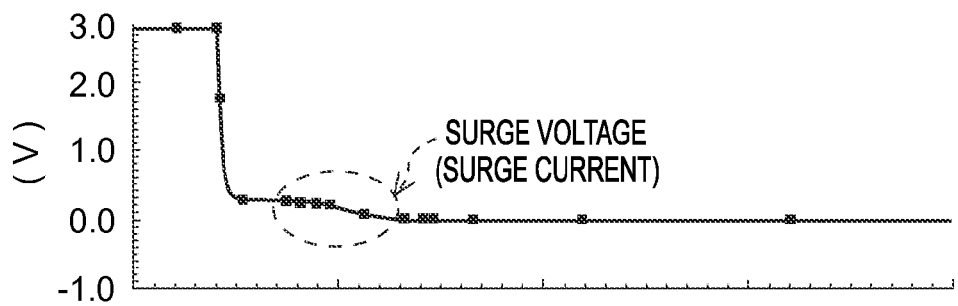
FIGS. 2A to 2C are graphs illustrating examples of a change with time of a voltage value or a current value during power-down of the amplifier of FIG. 1.
Figure 2B:
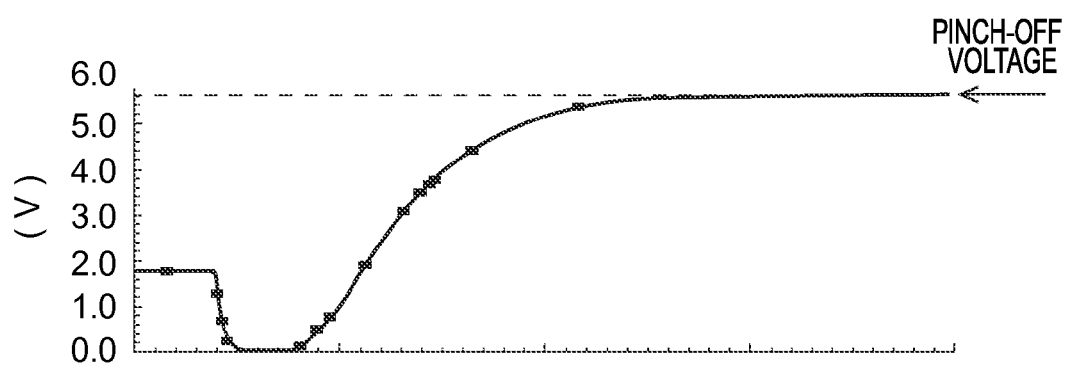
Figure 2C:
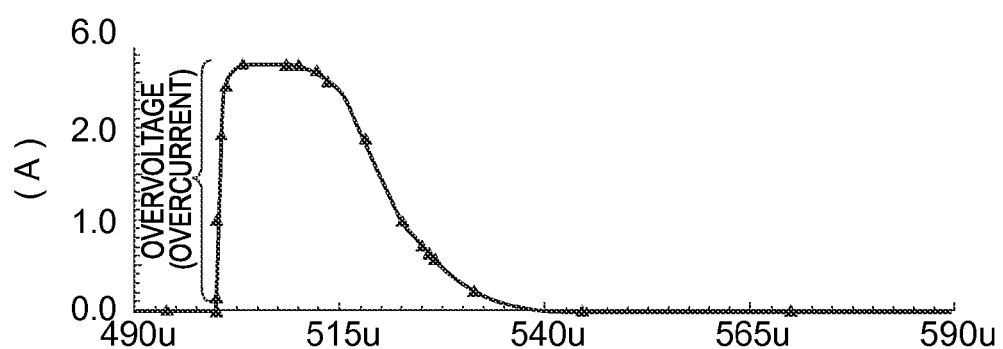

In the amplifier 150 having the above-described configuration, when the overcurrent detecting circuit 160 detects the overcurrent, the control circuit 158 controls the PMOS transistor 108 and the NMOS transistor 112 such that the non-conduction state is established between the source terminal and the drain terminal of each of the PMOS transistor 106 and the NMOS transistor 110. That is, the voltage applied to the gate terminal of each of the PMOS transistor 108 and the NMOS transistor 112 is controlled such that the conduction state is established between the source terminal and the drain terminal of each of the PMOS transistor 108 and the NMOS transistor 112. Therefore, the gate terminal of the PMOS transistor 106 is pulled up while the gate capacitance 166 is charged, and the gate terminal of the NMOS transistor 110 is pulled down while the gate capacitance 168 is charged. Compared with the amplifier 100 of FIG. 9, the voltage applied to the gate terminal of each of the PMOS transistor 106 and the NMOS transistor 110 is gently increased (for an example of the change with time of the voltage applied to the gate terminal of the PMOS transistor 106, see FIG. 2B). Therefore, the conduction state is gently changed to the non-conduction state between the source terminal and the drain terminal of each of the PMOS transistor 106 and the NMOS transistor 110. At the output terminal 114, compared with the case of FIG. 10C, the state in which the overcurrent is passed as illustrated in FIG. 2C is more gently changed to the state in which the current is not passed at the output terminal 114. As illustrated in FIG. 2A, the output voltage of the amplifier 150 is gently decreased to the ground voltage without generating the surge current at the output terminal 114. As a result, the amplifier 150 can be powered down without generating the latch-up in the PMOS transistor 106 and the NMOS transistor 110.

In the first embodiment, by way of example, the inductor component of about 350 nH exists on the assumption that each MOS transistor can have the gate capacitance of about 100 pF to about 300 pF. When the inductor component of about 500 nH exists on the assumption that each MOS transistor can have the gate capacitance of about 100 pF to about 300 pF, a time necessary to put an output transistor (for example, in the first embodiment, the PMOS transistor 106 and the NMOS transistor 110) in the conduction state into the non-conduction state is 3 µs or more (an upper limit is 20 ms in consideration of the breakdown due to the overcurrent). However, the time depends on maximu driving performance of the output MOS transistor (for example, in the first embodiment, the PMOS transistor 108 and the NMOS transistor 112) as the precondition. In the first embodiment, it is assumed that the maximum driving performance of the output MOS transistor ranges from 1 to 5 A. For example, when the output MOS transistor has the maximum driving performance of 5 A, the time necessary to make a transition from the conduction state to the non-conduction state is 5 µs or more. When other delay factors are included in a computation model of a delay time for the transition from the conduction state to the non-conduction state, the delay time t can simply be calculated using an equation "t=RC to 2RC". In this case, in consideration of the worst model, preferably the resistive element that forms the inductor component of 500 nH at t=RC is inserted as the resistive elements 154 and 156.

In the first embodiment, by way of example, the voltage is applied to the gate terminal of each of the PMOS transistor 108 and the NMOS transistor 112 such that the conduction state is established between the source terminal and the drain terminal of each of the PMOS transistor 108 and the NMOS transistor 112 when the overcurrent is detected. Alternatively, the voltage may be applied to the gate terminal of each of the PMOS transistor 108 and the NMOS transistor 112 such that the conduction state is established between the source terminal and the drain terminal of each of the PMOS transistor 108 and the NMOS transistor 112 at the normal time.

In the first embodiment, by way of example, the resistive element 154 is connected to the gate terminal of the PMOS transistor 106, and the source terminal of the PMOS transistor 108 is connected to the power supply wire VDD. Alternatively, the source terminal of the PMOS transistor 108 may be connected to the gate terminal of the PMOS transistor 106 while the resistive element 154 is connected to the power supply wire VDD. Thus, the PMOS transistor 108 and the resistive element 154, which are series-connected, may be inserted between the power supply wire VDD and the gate terminal of the PMOS transistor 106.

In the first embodiment, by way of example, the resistive element 156 is connected to the gate terminal of the NMOS transistor 110, and the source terminal of the NMOS transistor 112 is connected to the ground wire GND. Alternatively, the source terminal of the NMOS transistor 112 may be connected to the gate terminal of the NMOS transistor 110 while the resistive element 156 is connected to the ground wire GND. Thus, the NMOS transistor 112 and the resistive element 156, which are series-connected, may be inserted between the ground wire GND and the gate terminal of the NMOS transistor 110.

In the first embodiment, by way of example, the control circuit 158 controls the amplifier 150. Alternatively, a controller 16 of second to sixth embodiments may be used instead of the control circuit 158.

[Second Embodiment]

In the amplifier 150 of the first embodiment of FIG. 1, compared with the amplifier 100 of FIG. 1, irrespective of the existence or non-existence of the generation of the overcurrent, unfortunately the time necessary to make the transition to the power-down state is long since an instruction to make the transition to the power-down state is received, and the microscopic popping noise is generated during the transition to the power-down state at the normal time.

Figure 3:
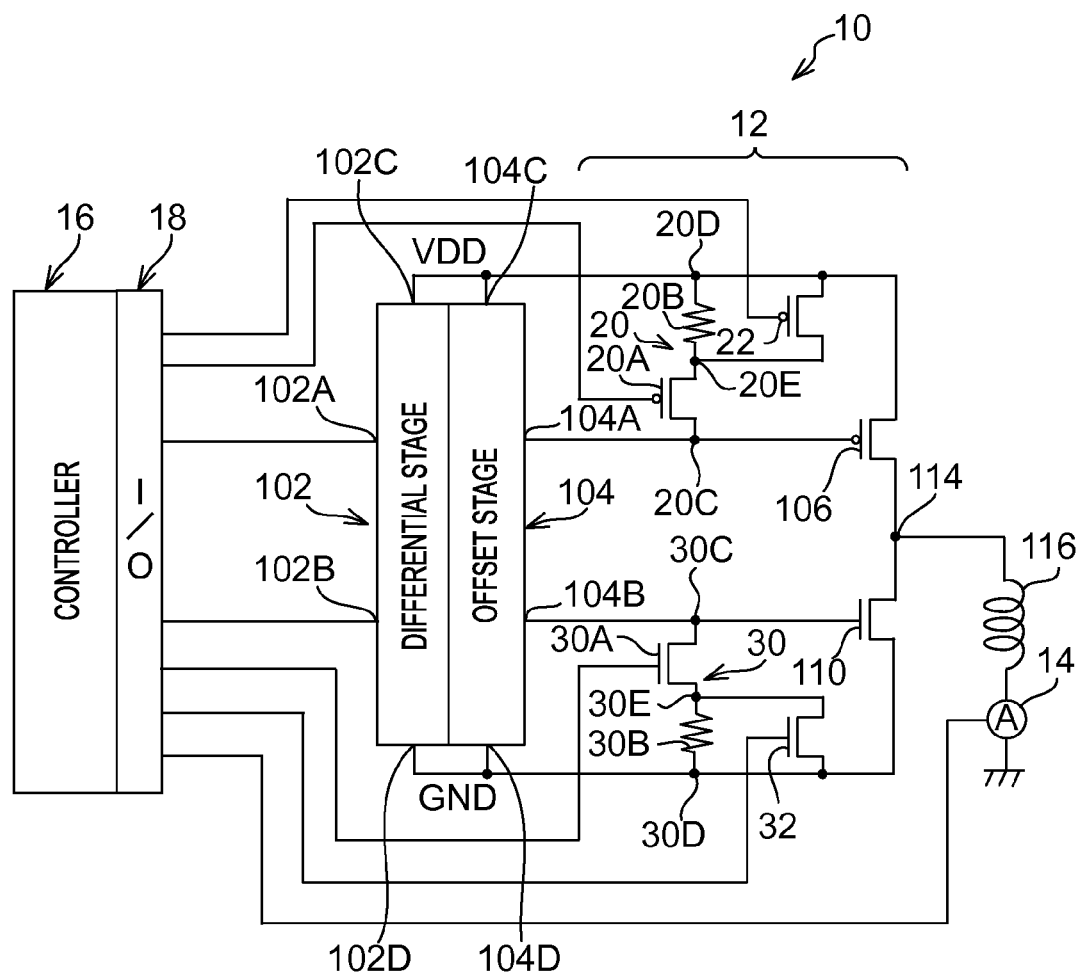
FIG. 3 is a view illustrating an example of a configuration of an amplifier according to a second embodiment of the invention.

An amplifier 10 according to a second embodiment of the invention that solves the problem will be described. FIG. 3 is a view illustrating an example of a configuration of the amplifier 10 of the second embodiment. As illustrated in FIG. 3, the amplifier 10 differs from the amplifier 100 of FIG. 9 in that an output stage 12 is replaced with an output stage 105 and that an ammeter 14, a control circuit 16, and an input/output port (hereinafter referred to as "I/O") 18 are further provided.

The output stage 12 differs from the output stage 105 of FIG. 9 in that a serial element unit 20 and a PMOS transistor 22 are used instead of the PMOS transistor 108 and that a serial element unit 30 and an NMOS transistor 32 are used instead of the NMOS transistor 112. The serial element unit 20 includes a PMOS transistor 20A that is of the first switching element and a resistive element 20B. The PMOS transistor 20A and the resistive element 20B are series-connected, one end 20C of the serial element unit 20 is connected to the gate terminal of the PMOS transistor 106, and another end 20D of the serial element unit 20 is connected to the power supply wire VDD that is of the first voltage line. The drain terminal of the PMOS transistor 20A constitutes the end 20C of the serial element unit 20. One end of the resistive element 20B is connected to the source terminal of the PMOS transistor 20A, and the other end of the resistive element 20B constitutes the end 20D of the serial element unit 20.

The drain terminal of the PMOS transistor 22 that is of the second switching element is connected to a connection portion 20E between the PMOS transistor 20A and the resistive element 20B of the serial element unit 20, and the source terminal of the PMOS transistor 22 is connected to the power supply wire VDD.

The serial element unit 30 includes an NMOS transistor 30A that is of the third switching element and a resistive element 30B that is of the third resistive element. The NMOS transistor 30A and the resistive element 30B are series-connected, an end 30C of the serial element unit 30 is connected to the gate terminal of the NMOS transistor 110, and an end 30D of the serial element unit 30 is connected to the ground wire GND as a first voltage line. The drain terminal of the NMOS transistor 30A constitutes the end 30C of the serial element unit 30. One end of the resistive element 30B is connected to the source terminal of the NMOS transistor 30A, and the other end of the resistive element 30B constitutes the end 30D of the serial element unit 30.

The drain terminal of the NMOS transistor 32 that is of the fourth switching element is connected to a connection portion 30E between the NMOS transistor 30A and the resistive element 30B of the serial element unit 30, and the source terminal of the NMOS transistor 32 is connected to the ground wire GND.

The ammeter 14 is inserted between the coil 116 and the ground point to measure the current passed from the coil 116 to the ground point.

The controller 16 is a computer including a CPU (Central Processing Unit) that executes a predetermined program to control the whole of amplifier 10, a ROM (Read Only Memory) in which a control program controlling activation of the amplifier 10, a power-down program, and various parameters are previously stored, and a RAM (Random Access Memory) that is used as a work area in executing various programs. The I/O 18 is an input/output port connected to the controller 16, and the output terminal of the ammeter 14, the positive input terminal 102A and the negative input terminal 102B of the differential stage 102, the gate terminals of the PMOS transistors 20A and 22, and the gate terminals of the NMOS transistors 30A and 32 are connected to the I/O 18. Accordingly, the controller 16 can recognize the measurement result of the ammeter 14 through the I/O 18, output the positive input signal and the negative input signal to the differential stage 102 through the I/O 18, and output the signal to the gate terminals of the PMOS transistors 20A and 22 and the NMOS transistors 30A and 32 through the I/O 18. In the second embodiment, the amplifier 10 is controlled by the software configuration by way of example. Alternatively, the amplifier may be controlled by a hardware configuration or a combined control method of the software configuration and the hardware configuration.

An operation of the amplifier 10 of the second embodiment will be described below. The case in which sound is output from the speaker through the amplifier 10 will be described. The case, in which the amplifier 10 is set to an initial state in order to avoid confusion and an analog sound signal expressing the sound that is a target output from the speaker is input from an external device (not illustrated) to the amplifier 10, will be described below. In the second embodiment, the "initial state" means the non-conduction state (the function as the switching element of each of the PMOS transistors 20A and 22 is in the off-state) between the drain terminal and the source terminal of each of the PMOS transistors 20A and 22, the non-conduction state (the function as the switching element of each of the NMOS transistors 30A and 32 is in the off-state) between the drain terminal and the source terminal of each of the NMOS transistors 30A and 32, the conduction state (the function as the switching element of the PMOS transistor 106 is in the on-state) between the drain terminal and the source terminal of the PMOS transistor 106, and the conduction state (the function as the switching element of the NMOS transistor 110 is in the on-state) between the drain terminal and the source terminal of the NMOS transistor 110.

The controller 16 outputs the sound signal expressing the sound output from the speaker (not illustrated) to the differential stage 102A through the I/O 18 while a polarity of the sound signal is inverted. The differential stage 102A generates the difference voltage signals between the positive input signal and the negative input signal as the sound signal input from the controller 16, and amplifies the generated difference voltage signal. The differential stage 102A outputs the negative-electrode differential signal to the NMOS transistor 110 through the offset stage 104 while outputting the positive-electrode differential signal to the gate terminal of the PMOS transistor 106 through the offset stage 104.

The PMOS transistor 106 and the NMOS transistor 110 becomes the conduction state or the non-conduction state according to the voltage based on the differential signal input from the offset stage 104. When the speaker is connected to the output terminal 114, the sound signal that is restored into the original analog signal by the current output from the output terminal 114 is reproduced from the speaker.

In the amplifier of the second embodiment, power-down processing that makes provision for the generation of the overcurrent is performed.

Figure 4:
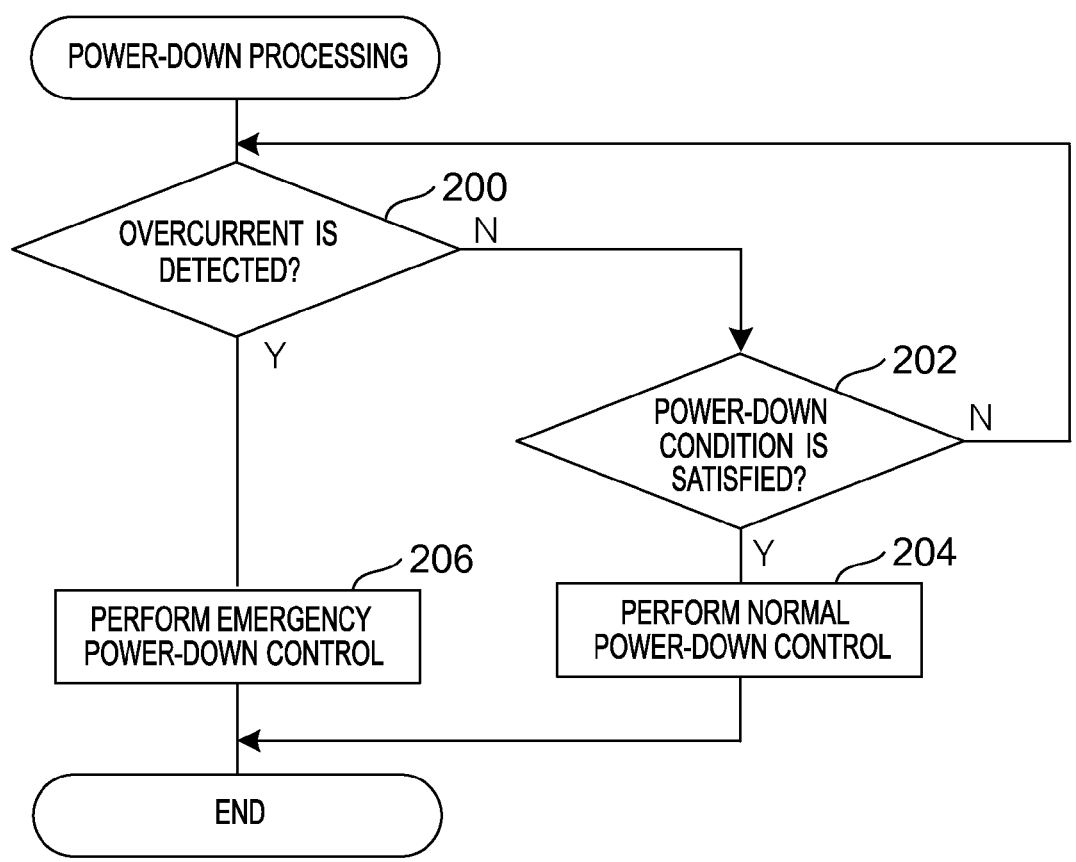
FIG. 4 is a flowchart illustrating a processing flow of power-down processing of the second embodiment.

An operation of the amplifier 10 that currently performs the power-down processing will be described below with reference to FIG. 4. FIG. 4 is a flowchart illustrating a processing flow of the power-down processing that is performed by the controller 16 in turning on the power (not illustrated) of the amplifier 10. In order to avoid confusion, it is assumed that the controller 16 detects the passage of the overcurrent through the output terminal 114 based on the current value measured by the ammeter 14.

Referring to FIG. 4, whether the overcurrent is detected is determined in Step 200. If the determination is negative, the flow goes to Step 202. Whether a condition that the amplifier 10 is caused to transition to the power-down state (for example, a condition that the controller 16 receives an instruction to cut off the power of the amplifier 100, or a condition that a predetermined time elapses since the power of the amplifier 100 is turned on) is satisfied is determined in Step 202. If the determination is negative, the flow returns to Step 200, while if the determination is positive, the flow goes to Step 204, the power-down processing program is ended after performing a normal power-down control that is a power-down control when the overcurrent is not generated. In Step 204, specifically, the corresponding on-voltages are applied to the gate terminals of the PMOS transistors 20A and 22 and the NMOS transistors 30A and 32 such that the PMOS transistors 20A and 22 in the non-conduction state and the NMOS transistors 30A and 32 in the non-conduction state are put into the conduction state. As used herein, the "on-voltage" means the gate voltage at which the MOS transistor is put into the conduction state (the function as the switching element of the MOS transistor is in the on-state) between the source terminal and the drain terminal.

The PMOS transistor 20A becomes the conduction state according to the processing in Step 204. Because the PMOS transistor 22 also becomes the conduction state, the short-circuit state is established between the end 20D of the serial element unit 20 and the connection portion 20E, and the power supply voltage is applied from the power supply wire VDD to the gate terminal of the PMOS transistor 106 through the PMOS transistors 22 and 20A. Therefore, the PMOS transistor 106 becomes the non-conduction state (the gate terminal of the PMOS transistor 106 is pulled up).

The NMOS transistor 30A becomes the conduction state according to the processing in Step 204. Because the NMOS transistor 32 also becomes the conduction state, the short-circuit state is established between the end 30D of the serial element unit 30 and the connection portion 30E, and the ground voltage is applied from the ground wire GND to the gate terminal of the NMOS transistor 110 through the NMOS transistors 32 and 30A. Therefore, the NMOS transistor 110 becomes the non-conduction state (the gate terminal of the NMOS transistor 110 is pulled down).

On the other hand, if the determination is positive in Step 200, the flow goes to Step 206, and the power-down processing program is ended after performing an emergency power-down control that is a power-down control when the overcurrent is generated. In Step 206, specifically, the corresponding on-voltages are applied to the gate terminals of the PMOS transistor 20A and the NMOS transistor 30A in the PMOS transistors 20A and 22 in the non-conduction state and the NMOS transistors 30A and 32 in the non-conduction state.

The PMOS transistor 20A and the NMOS transistor 30A become the conduction state according to the processing in Step 206. At this point, because both the PMOS transistor 22 and the NMOS transistor 32 are in the non-conduction state, the current passed through the output terminal 114 exerts the same behavior as the amplifier 150 of FIG. 1 during the transition to the power-down state. That is, the generation of the negative surge current is suppressed. Therefore, the latch-up of the PMOS transistor 106 and the NMOS transistor 110 can be prevented.

In the second embodiment, the PMOS transistor 22 becomes dominant by setting the on-resistance of the PMOS transistor 22 to the resistance value smaller than that of the resistive element 20B, and the NMOS transistor 32 becomes dominant by setting the on-resistance of the NMOS transistor 32 to the resistance value smaller than that of the resistive element 30B. In the case in which both the PMOS transistors 20A and 22 are put into the conduction state, the power-down time can be equalized to that of the pull-up in the PMOS transistor 108 of the amplifier 100 of FIG. 9 by changing dimensions of the PMOS transistors 20A and 22, and in the case in which both the NMOS transistors 30A and 32 are put into the conduction state, the power-down time can be equalized to that of the pull-down in the NMOS transistor 112 of the amplifier 100 of FIG. 9 by changing dimensions of the NMOS transistors 30A and 32.

[Third Embodiment]

Figure 5:
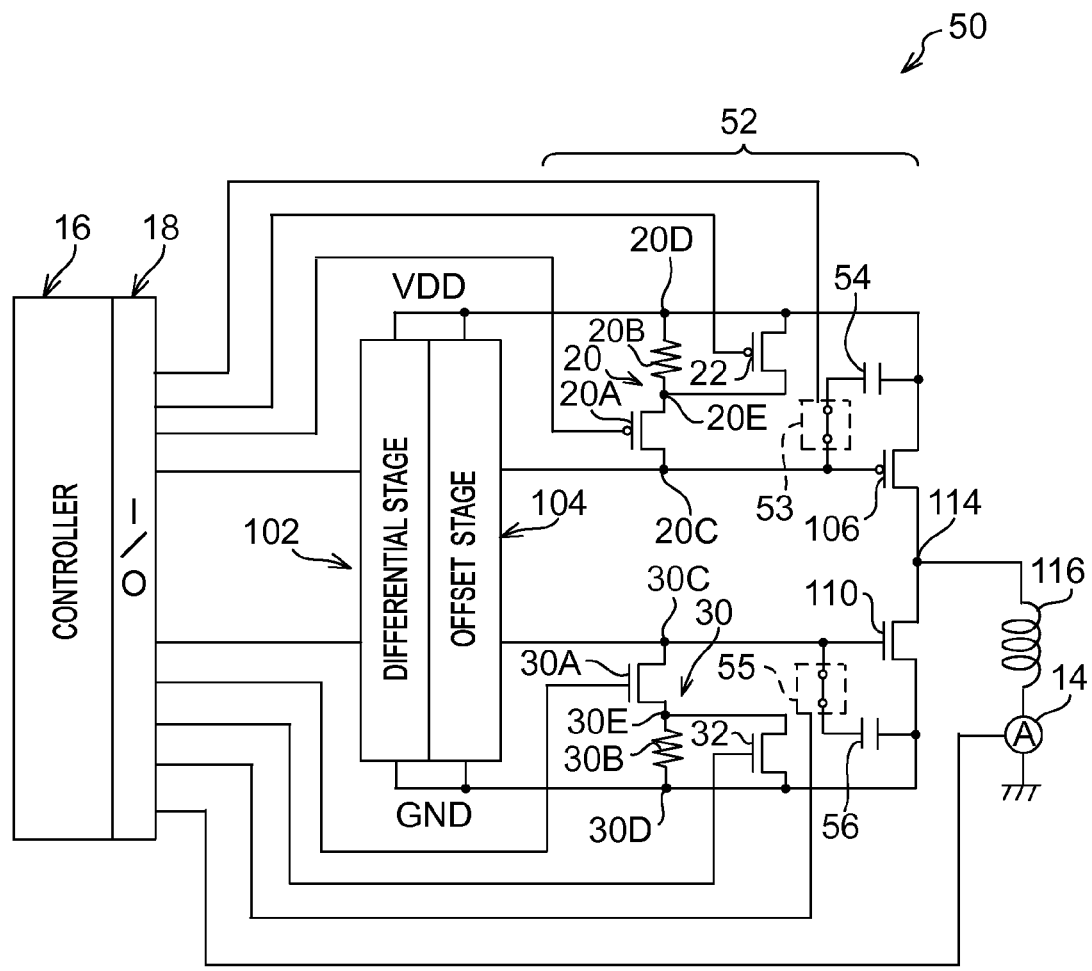
FIG. 5 is a view illustrating an example of a configuration of an amplifier according to a third embodiment of the invention.

FIG. 5 is a view illustrating an example of a configuration of an amplifier 50 according to a third embodiment of the invention. The amplifier 50 of the second embodiment differs from the amplifier 10 of FIG. 3 only in that an output stage 52 is used instead of the output stage 12. Therefore, in the third embodiment, only a different point from the second embodiment is described. In the third embodiment, the same component as the second embodiment is designated by the same numeral, and the description is omitted.

The output stage 52 differs from the output stage 12 in that a switch 53 that is of the charging permission/prohibition switching unit, a capacitor 54 that is of the capacitive load, a switch 55 that is of the third charging permission/prohibition switching unit, and a capacitor 56 that is of the third capacitive load are further provided.

One of electrodes of the capacitor 54 is connected to the gate terminal of the PMOS transistor 106 through the switch 53, and the other electrode is connected to the source terminal of the PMOS transistor 106.

One of electrodes of the capacitor 56 is connected to the gate terminal of the NMOS transistor 110 through the switch 55, and the other electrode is connected to the source terminal of the NMOS transistor 110.

The switch 53 includes a first terminal, a second terminal, and a control terminal. The switch 53 switches between the conduction state (the conduction state between the first terminal and the second terminal) and the non-conduction state (the non-conduction state between the first terminal and the second terminal), whereby the capacitor 54 switches between the charging state and the non-charging state. The first terminal of the switch 53 is connected to one of the electrodes of the capacitor 54, and the second terminal of the switch 53 is connected to the gate terminal of the PMOS transistor 106. The control terminal of the switch 53 is connected to the controller 16 through the I/O 18. Accordingly, the controller 16 can switch the conduction state and the non-conduction state of the switch 53 through the I/O 18.

The switch 55 includes a first terminal, a second terminal, and a control terminal. The switch 55 switches between the conduction state (the conduction state between the first terminal and the second terminal) and the non-conduction state (the non-conduction state between the first terminal and the second terminal), whereby the capacitor 56 switches between the charging state and the non-charging state. The first terminal of the switch 55 is connected to one of the electrodes of the capacitor 56, and the second terminal of the switch 55 is connected to the gate terminal of the NMOS transistor 110. The control terminal of the switch 55 is connected to the controller 16 through the I/O 18. Accordingly, the controller 16 can switch the conduction state and the non-conduction state of the switch 55 through the I/O 18.

Figure 6:
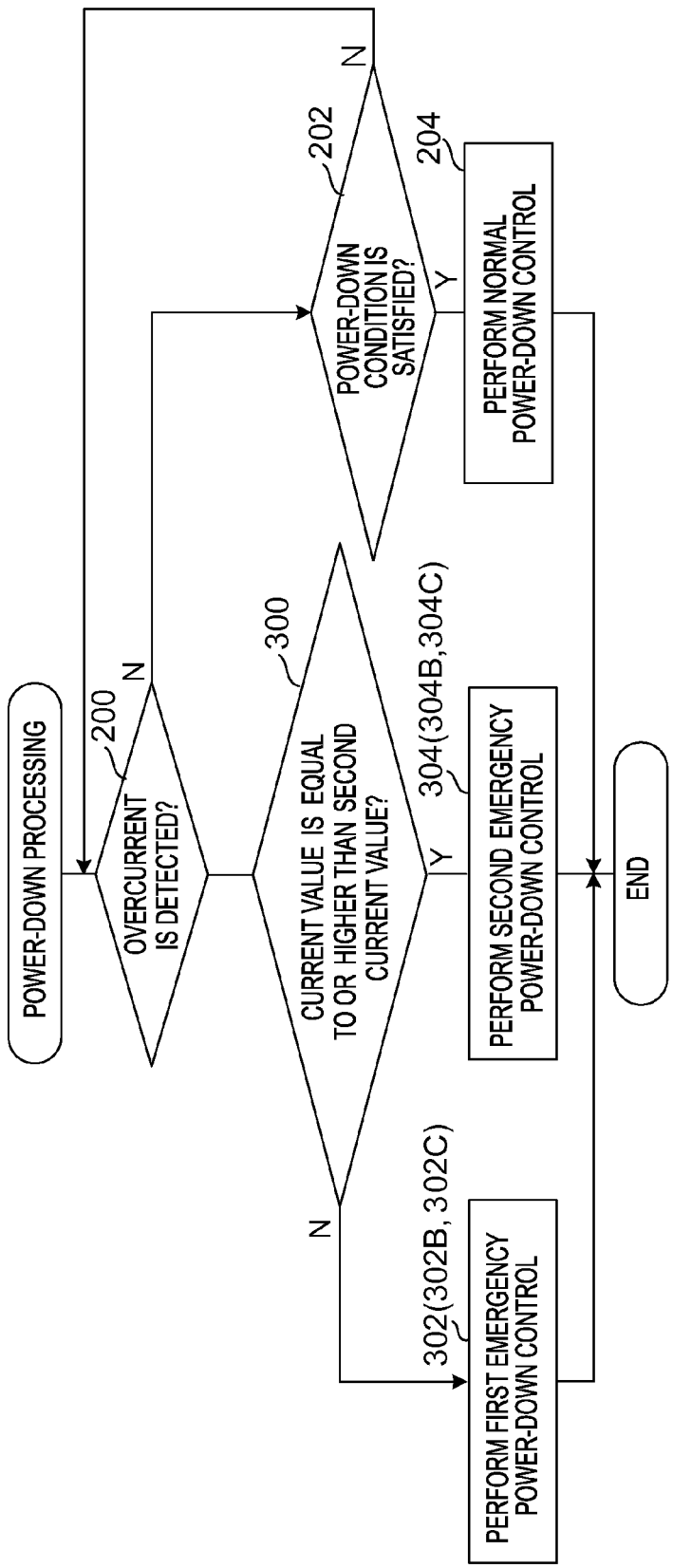
FIG. 6 is a flowchart illustrating a processing flow of power-down processing according to third to fifth embodiments of the invention.

An operation of the amplifier 50 that currently performs the power-down processing will be described below with reference to FIG. 6. FIG. 6 is a flowchart illustrating a processing flow of the power-down processing that is performed by the controller 16 in turning on the power (not illustrated) of the amplifier 50. The same steps as the power-down processing of FIG. 4 are designated by the same numerals, and the descriptions are omitted. In order to avoid confusion, it is assumed in the processing of Step 200 that the overcurrent is detected when the current value of the current passed through the output terminal 114 is equal to or higher than the first current value, and it is assumed that the current value (the current value larger than at least the first current value) of the overcurrent that is previously fixed because the measure against the latch-up is insufficient in the circuit configuration of the amplifier 10 of FIG. 3 is set to the second current value.

If the determination is positive in Step 200 of FIG. 6, the flow goes to Step 300. Whether the current value measured by the ammeter 14 is equal to or higher than the second current value is determined in Step 300. If the determination is negative, a determination that the current value of the currently-passed overcurrent is equal to or higher than the first current value and lower than the second current value is made, and the flow goes to Step 302. First emergency power-down control that is the power-down control when the overcurrent is equal to or higher than the first current value and lower than the second current value is passed is performed in Step 302. Then the power-down processing program is ended. In Step 302, specifically, the corresponding on-voltages are applied to the gate terminals of the PMOS transistor 20A and the NMOS transistor 30A among the PMOS transistors 20A and 22 in the non-conduction state and the NMOS transistors 30A and 32 in the non-conduction state, and the switches 53 and 55 are controlled so as to be put into the non-conduction state.

The PMOS transistor 20A and the NMOS transistor 30A become the conduction state according to the processing in Step 302. The switches 53 and 55 become the non-conduction state. Therefore, the gate terminal of the PMOS transistor 106 is pulled up through the resistive element 20B and the PMOS transistor 20A, and the gate terminal of the NMOS transistor 110 is pulled down through the resistive element 30B and the NMOS transistor 30A.

On the other hand, if the determination is positive in Step 300, the flow goes to Step 304. Second emergency power-down control that is the power-down control when the overcurrent equal to or higher than the second current value is passed is performed in Step 304. Then, the power-down processing program is ended. In Step 304, specifically, the corresponding on-voltages are applied to the gate terminals of the PMOS transistor 20A and the NMOS transistor 30A among the PMOS transistors 20A and 22 in the non-conduction state and the NMOS transistors 30A and 32 in the non-conduction state, and the switches 53 and 55 are controlled so as to be put into the conduction state.

The PMOS transistor 20A and the NMOS transistor 30A become the conduction state according to the processing in Step 304. The switches 53 and 55 also become the conduction state. Therefore, the gate terminal of the PMOS transistor 106 is pulled up through the resistive element 20B and the PMOS transistor 20A while the capacitor 54 is charged, and the gate terminal of the NMOS transistor 110 is pulled down through the resistive element 30B and the NMOS transistor 30A while the capacitor 56 is charged.

Accordingly, the gate terminal of the PMOS transistor 106 is more slowly pulled up through the processing in Step 304 compared with the case in which the gate terminal of the PMOS transistor 106 is pulled up through the processing in Step 302. The gate terminal of the NMOS transistor 110 is more slowly pulled down through the processing in Step 304 compared with the case in which the gate terminal of the NMOS transistor 110 is pulled down through the processing in Step 302. That is, in the amplifier 50, because the capacitors 54 and 56 are charged during the power-down when the overcurrent is equal to or higher than the second current value, the PMOS transistor 106 and the NMOS transistor 110 transition more gently (more slowly) from the conduction state to the non-conduction state compared with the case in which the overcurrent is equal to or higher than the first current value and lower than the second current value by time constants of the resistive element 20B and the capacitor 54 and time constants of the resistive element 30B and the capacitor 56. Therefore, the latch-up of the PMOS transistor 106 and the NMOS transistor 110 can more securely be prevented.

In the third embodiment, the PMOS transistor 22 and the NMOS transistor 32 are used by way of example. However, the invention can be implemented with no use of the PMOS transistor 22 and the NMOS transistor 32. In this case, in the processing in Step 204 of the power-down processing program of the third embodiment, it is not necessary to apply the on-voltages to the gate terminals of the PMOS transistor 22 and the NMOS transistor 32, so that a processing load on the controller 16 can be reduced. Although the invention can be implemented with no use of the switches 53 and 55, preferably the switches 53 and 55 are used when switching response speed of the PMOS transistor 106 and the NMOS transistor 110 are changed in the multistep manner according to the current. For example, the switch 53 is put into the non-conduction state when the power-down is performed at the normal time, and the switch 53 is put into the conduction state when the overcurrent is generated. The invention can be implemented with no use of the switches 53 and 55. In this case, preferably the gate capacitance (in the third embodiment, the gate capacitances of the PMOS transistor 106 and the NMOS transistor 110) of the MOS transistor is used instead of the capacitors 54 and 56.

[Fourth Embodiment]

Figure 7:
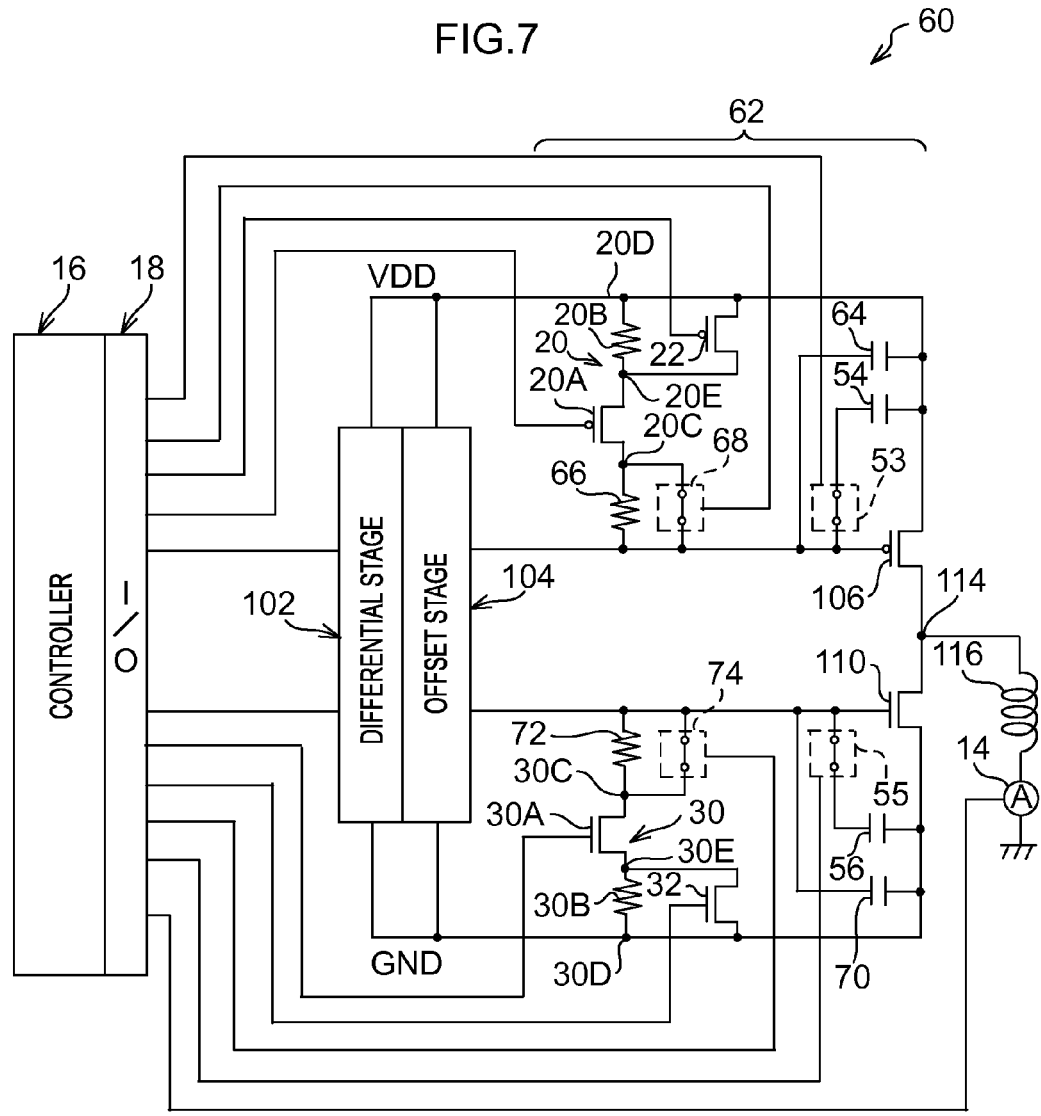
FIG. 7 is a view illustrating an example of a configuration of an amplifier of the fourth embodiment.

FIG. 7 is a view illustrating an example of a configuration of an amplifier 60 according to a fourth embodiment of the invention. The amplifier 60 of the fourth embodiment differs from the amplifier 50 of FIG. 5 only in that an output stage 62 is used instead of the output stage 52. Therefore, in the third embodiment, only a different point from the third embodiment is described. In the third embodiment, the same component as the second embodiment is designated by the same numeral, and the description is omitted.

The output stage 62 differs from the output stage 52 of FIG. 5 in the following points. That is, the end 20C of the serial element unit 20 is not directly connected to the gate terminal of the PMOS transistor 106, the end 30C of the serial element unit 30 is not directly connected to the gate terminal of the NMOS transistor 110, a capacitor 64 is further provided as the second capacitive load, a switch 68 is further provided as the short-circuit/non-short-circuit switching unit, a capacitor 70 is further provided as the fourth capacitive load, a resistive element 66 is further provided as the second resistive element, a resistive element 72 is further provided as the fourth resistive element, and a switch 74 is further provided as the second short-circuit/non-short-circuit switching unit.

One of electrodes of the capacitor 64 is connected to the gate terminal of the PMOS transistor 106 while the other electrode is connected to the source terminal of the PMOS transistor 106 such that the capacitor 64 is parallel-connected to the capacitor 54.

The resistive element 66 is series-connected to the serial element unit 20. Specifically, one end of the resistive element 66 is connected to the gate terminal of the PMOS transistor 106, and the other end is connected to the end 20C of the serial element unit 20.

The switch 68 includes a first terminal, a second terminal, and a control terminal. The switch 68 switches between the conduction state (the conduction state between the first terminal and the second terminal) and the non-conduction state (the non-conduction state between the first terminal and the second terminal), whereby the resistive element 66 switches between the short-circuit state and the non-short-circuit state. The first terminal of the switch 68 is connected to the end 20C of the serial element unit 20, the second terminal of the switch 68 is connected to the gate terminal of the PMOS transistor 106, and the control terminal of the switch 68 is connected to the controller 16 through the I/O 18. Accordingly, the controller 16 can switch the conduction state and the non-conduction state of the switch 68 through the I/O 18.

One of electrodes of the capacitor 70 is connected to the gate terminal of the NMOS transistor 110 while the other electrode is connected to the source terminal of the NMOS transistor 110 such that the capacitor 70 is parallel-connected to the capacitor 56.

The resistive element 72 is series-connected to the serial element unit 30. Specifically, one end of the resistive element 72 is connected to the gate terminal of the NMOS transistor 110, and the other end is connected to the end 30C of the serial element unit 30.

The switch 74 includes a first terminal, a second terminal, and a control terminal. The switch 74 switches between the conduction state (the conduction state between the first terminal and the second terminal) and the non-conduction state (the non-conduction state between the first terminal and the second terminal), whereby the resistive element 72 switches between the short-circuit state and the non-short-circuit state. The first terminal of the switch 74 is connected to the end 30C of the serial element unit 30, the second terminal of the switch 74 is connected to the gate terminal of the NMOS transistor 110, and the control terminal of the switch 74 is connected to the controller 16 through the I/O 18. Accordingly, the controller 16 can switch the conduction state and the non-conduction state of the switch 74 through the I/O 18.

An operation of the amplifier 60 that currently performs the power-down processing will be described below with reference to FIG. 6. FIG. 6 is the flowchart illustrating the processing flow of the power-down processing that is performed by the controller 16 in turning on the power (not illustrated) of the amplifier 60. The same steps as the power-down processing of FIG. 4 are designated by the same numerals, and the descriptions are omitted. In order to avoid confusion, it is assumed in the processing of Step 200 that the overcurrent is detected when the current value of the current passed through the output terminal 114 is equal to or higher than the first current value, and it is assumed that the current value (the current value larger than at least the first current value) of the overcurrent that is previously fixed because the measure against the latch-up is insufficient in the circuit configuration of the amplifier 50 of FIG. 5 is set to the second current value.

If the determination is negative in Step 300 of FIG. 6, the flow goes to Step 302B. After the first emergency power-down control of the fourth embodiment is performed in Step 302B, the power-down processing program is ended. In Step 302B, specifically, the corresponding on-voltages are applied to the gate terminals of the PMOS transistor 20A and the NMOS transistor 30A among the PMOS transistors 20A and 22 in the non-conduction state and the NMOS transistors 30A and 32 in the non-conduction state, the switches 68 and 74 are controlled so as to be put into the conduction state, and the switches 53 and 55 are controlled so as to be put into the non-conduction state.

The PMOS transistor 20A and the NMOS transistor 30A become the conduction state according to the processing in Step 302. The switches 68 and 74 also become the conduction state, and the short-circuit state is established between both the ends of the resistive element 66 and between both the ends of the resistive element 72. Therefore, the gate terminal of the PMOS transistor 106 is pulled up through the resistive element 20B, the PMOS transistor 20A, and the switch 68 while the capacitor 64 is charged, and the gate terminal of the NMOS transistor 110 is pulled down through the resistive element 30B, the NMOS transistor 30A, and the switch 74 while the capacitor 70 is charged.

Accordingly, the gate terminal of the PMOS transistor 106 is more slowly pulled up through the processing in Step 302B compared with the case in which the gate terminal of the PMOS transistor 106 of the amplifier 50 of the third embodiment of FIG. 5 is pulled up through the processing in Step 302, and the gate terminal of the NMOS transistor 110 is more slowly pulled down through the processing in Step 302B compared with the case in which the gate terminal of the NMOS transistor 110 of the amplifier 50 of the third embodiment of FIG. 5 is pulled down through the processing in Step 302. That is, in the amplifier 60, because the capacitors 64 and 70 are charged during the power-down in the case when the overcurrent is equal to or higher than the second current value and lower than the second current value, the PMOS transistor 106 and the NMOS transistor 110 transition more gently (more slowly) from the conduction state to the non-conduction state by time constants of the resistive element 20B and the capacitor 64 and time constants of the resistive element 30B and the capacitor 70, compared with the case when the overcurrent equal to or higher than the first current value and lower than the second current value is passed through the amplifier 50 of the third embodiment.

On the other hand, if the determination is positive in Step 300, the flow goes to Step 304B. After the second emergency power-down control of the fourth embodiment is performed in Step 304B, the power-down processing program is ended. In Step 304B, specifically, the corresponding on-voltages are applied to the gate terminals of the PMOS transistor 20A and the NMOS transistor 30A among the PMOS transistors 20A and 22 in the non-conduction state and the NMOS transistors 30A and 32 in the non-conduction state, the switches 68 and 74 are controlled so as to be put into the non-conduction state, and the switches 53 and 55 are controlled so as to be put into the conduction state.

The PMOS transistor 20A and the NMOS transistor 30A become the conduction state according to the processing in Step 304B. The switches 53 and 55 also become the conduction state. The switches 68 and 74 become the non-conduction state, and the non-short-circuit state is established between both the ends of the resistive element 66 and between both the ends of the resistive element 72. Therefore, the gate terminal of the PMOS transistor 106 is pulled up through the resistive element 20B, the PMOS transistor 20A, and the resistive element 66 while the capacitors 54 and 64 are charged, and the gate terminal of the NMOS transistor 110 is pulled down through the resistive element 30B, the NMOS transistor 30A, and the resistive element 72 while the capacitors 56 and 70 are charged.

Accordingly, the gate terminal of the PMOS transistor 106 is more slowly pulled up through the processing in Step 304B compared with the case in which the gate terminal of the PMOS transistor 106 is pulled up through the processing in Step 302B. The gate terminal of the NMOS transistor 110 is more slowly pulled down through the processing in Step 304B compared with the case in which the gate terminal of the NMOS transistor 110 is pulled down through the processing in Step 302B. That is, in the amplifier 60, because the capacitors 54, 56, 64, and 70 are charged during the power-down when the overcurrent is equal to or higher than the second current value, the PMOS transistor 106 and the NMOS transistor 110 transition more gently (more slowly) from the conduction state to the non-conduction state by time constants of the resistive element 20B and the capacitors 54 and 64 and time constants of the resistive element 30B and the capacitors 56 and 70, compared with the case of the processing in Step 302B.

In the fourth embodiment, the switches 53 and 55 are put into the non-conduction state through the processing in Step 302B. Alternatively, the switches 53 and 55 may be put into the conduction state. In this case, because the capacitors 54 and 56 are charged, the time necessary to pull up the PMOS transistor 106 and the time necessary to pull down the NMOS transistor 110 can be delayed compared with the case in which the switches 53 and 55 are put into the non-conduction state. Accordingly, the conduction state and the non-conduction state of the switches 53 and 55 can separately be used according to the usage environment of the amplifier 60 and the on-resistances of the PMOS transistor 106 and the NMOS transistor 110.

In the fourth embodiment, the switches 68 and 74 are put into the conduction state through the processing in Step 302B while the switches 68 and 74 are put into the non-conduction state through the processing in Step 304B. Alternatively, the switches 68 and 74 may always be put into the conduction state or the non-conduction state.

In the fourth embodiment, the case in which the overcurrent is equal to or higher than the first current value and lower than the second current value differs from the case in which the overcurrent is equal to or higher than the second current value in the time necessary for the PMOS transistor 106 and the NMOS transistor 110 to transition from the conduction state to the non-conduction state. Alternatively, for example, the case in which the overcurrent is equal to or higher than the first current value and lower than the second current value, the case in which the overcurrent is equal to or higher than the second current value and lower than a third current value, and the case in which the overcurrent is equal to or higher than the third current value may differ from one another in the time necessary for the PMOS transistor 106 and the NMOS transistor 110 to transition from the conduction state to the non-conduction state. In this case, for example, the controller 16 may perform control such that the switches 53 and 55 are put in to the non-conduction state while the switches 68 and 74 are put into the conduction state when the overcurrent is equal to or higher than the first current value and lower than the second current value, such that the switches 53 and 55 are put in to the conduction state while the switches 68 and 74 are put into the conduction state when the overcurrent is equal to or higher than the second current value and lower than the third current value, and such that the switches 53 and 55 are put in to the conduction state while the switches 68 and 74 are put into the non-conduction state when the overcurrent is equal to or higher than the third current value.

In the fourth embodiment, the PMOS transistor 22 and the NMOS transistor 32 are used by way of example. However, the invention can be implemented with no use of the PMOS transistor 22 and the NMOS transistor 32. In this case, in the processing in Step 204 of the power-down processing program of the fourth embodiment, it is not necessary to apply the on-voltages to the gate terminals of the PMOS transistor 22 and the NMOS transistor 32, so that a processing load on the controller 16 can be reduced. Although the invention can be implemented with no use of the switches 53 and 55, preferably the switches 53 and 55 are used when switching response speed of the PMOS transistor 106 and the NMOS transistor 110 are changed in the multistep manner according to the current. For example, the switch 53 is put into the non-conduction state when the power-down is performed at the normal time, and the switch 53 is put into the conduction state when the overcurrent is generated.

[Fifth Embodiment]

Figure 8:
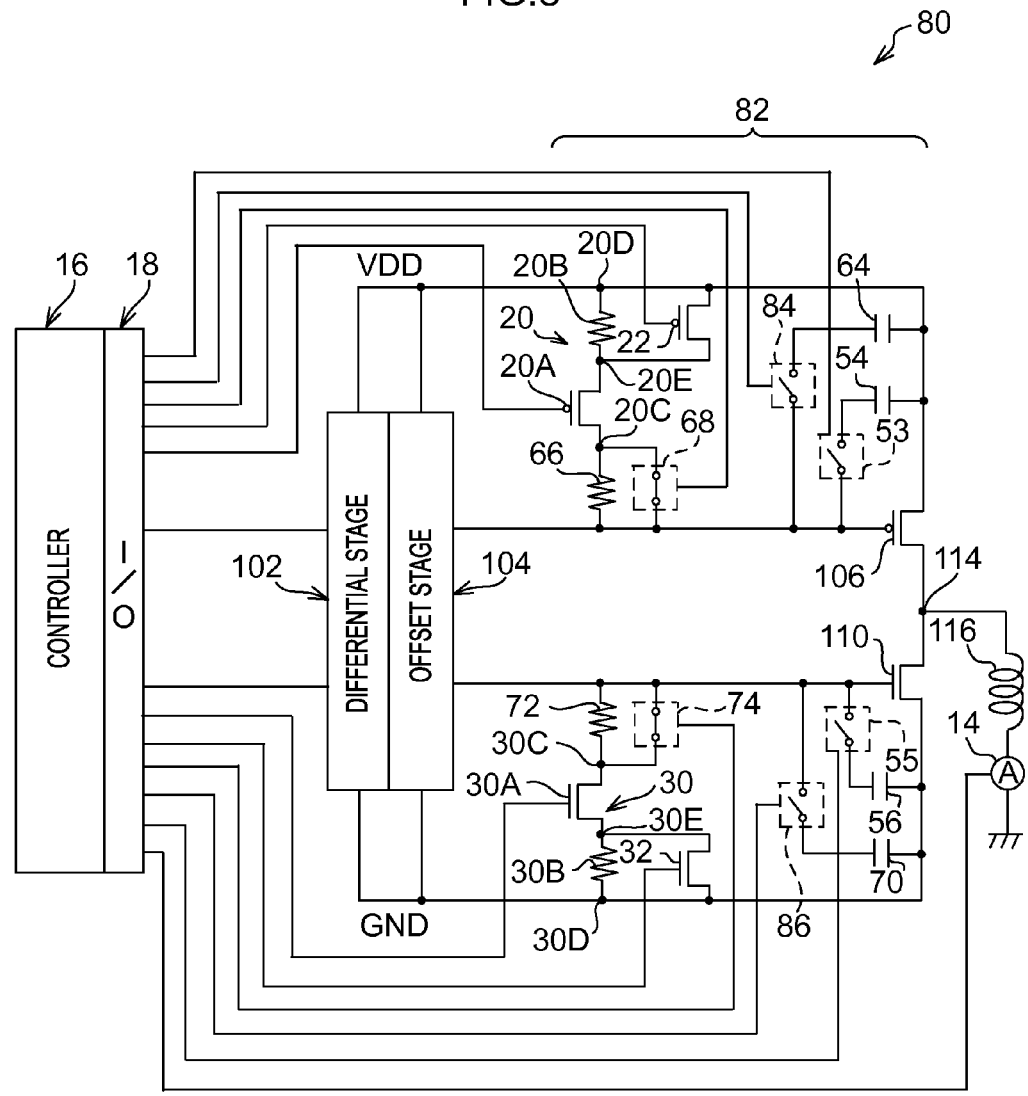
FIG. 8 is a view illustrating an example of a configuration of an amplifier of the fifth embodiment.

FIG. 8 is a view illustrating an example of a configuration of an amplifier 80 according to a fifth embodiment of the invention. The amplifier 80 of the fifth embodiment differs from the amplifier 60 of FIG. 7 only in that an output stage 82 is used instead of the output stage 62. Therefore, in the fifth embodiment, only a different point from the fourth embodiment is described. In the fifth embodiment, the same component as the fourth embodiment is designated by the same numeral, and the description is omitted.

The output stage 82 differs from the output stage 62 of FIG. 7 in the following points. That is, one of the electrodes of the capacitor 64 is not directly connected to the gate terminal of the PMOS transistor 106, one of the electrodes of the capacitor 70 is not directly connected to the gate terminal of the NMOS transistor 110, a switch 84 is further provided as the second charging permission/prohibition switching unit, and a switch 86 is further provided as the fourth charging permission/prohibition switching unit.

The switch 84 includes a first terminal, a second terminal, and a control terminal. The switch 84 switches between the conduction state (the conduction state between the first terminal and the second terminal) and the non-conduction state (the non-conduction state between the first terminal and the second terminal), whereby the capacitor 64 switches between the charging state and the non-charging state. The first terminal of the switch 84 is connected to one of the electrodes of the capacitor 64, and the second terminal of the switch 84 is connected to the gate terminal of the PMOS transistor 106. The control terminal of the switch 84 is connected to the controller 16 through the I/O 18. Accordingly, the controller 16 can switch the conduction state and the non-conduction state of the switch 84 through the I/O 18.

The switch 86 includes a first terminal, a second terminal, and a control terminal.

The switch 86 switches between the conduction state (the conduction state between the first terminal and the second terminal) and the non-conduction state (the non-conduction state between the first terminal and the second terminal), whereby the capacitor 70 switches between the charging state and the non-charging state. The first terminal of the switch 86 is connected to one of the electrodes of the capacitor 70, and the second terminal of the switch 86 is connected to the gate terminal of the NMOS transistor 110. The control terminal of the switch 86 is connected to the controller 16 through the I/O 18. Accordingly, the controller 16 can switch the conduction state and the non-conduction state of the switch 86 through the I/O 18.

An operation of the amplifier 80 that currently performs the power-down processing will be described below with reference to FIG. 6. FIG. 6 is the flowchart illustrating the processing flow of the power-down processing that is performed by the controller 16 in turning on the power (not illustrated) of the amplifier 80. In the power-down processing program of the fifth embodiment, the same components as the third embodiment are designated by the same numerals, and the descriptions are omitted.

If the determination is negative in Step 300 of FIG. 6, the flow goes to Step 302C. After the first emergency power-down control of the fifth embodiment is performed in Step 302C, the power-down processing program is ended. In Step 302C, specifically, the corresponding on-voltages are applied to the gate terminals of the PMOS transistor 20A and the NMOS transistor 30A in the PMOS transistors 20A and 22 in the non-conduction state and the NMOS transistors 30A and 32 in the non-conduction state, the switches 68 and 74 are controlled so as to be put into the conduction state, and the switches 53, 55, 84, and 86 are controlled so as to be put into the non-conduction state.

The PMOS transistor 20A and the NMOS transistor 30A become the conduction state according to the processing in Step 302C. The switches 68 and 74 also become the conduction state, and the short-circuit state is established between both the ends of the resistive element 66 and between both the ends of the resistive element 72. The switches 53, 55, 84, and 86 become the non-conduction state. Therefore, the gate terminal of the PMOS transistor 106 is pulled up through the resistive element 20B, the PMOS transistor 20A, and the switch 68, and the gate terminal of the NMOS transistor 110 is pulled down through the resistive element 30B, the PMOS transistor 30A, and the switch 74.

On the other hand, if the determination is positive in Step 300, the flow goes to Step 304C. After the second emergency power-down control of the fourth embodiment is performed in Step 304C, the power-down processing program is ended. In Step 304C, specifically, the corresponding on-voltages are applied to the gate terminals of the PMOS transistor 20A and the NMOS transistor 30A among the PMOS transistors 20A and 22 in the non-conduction state and the NMOS transistors 30A and 32 in the non-conduction state, the switches 68 and 74 are controlled so as to be put into the non-conduction state, and the switches 53, 55, 84, and 86 are controlled so as to be put into the conduction state.

The PMOS transistor 20A and the NMOS transistor 30A become the conduction state according to the processing in Step 304C. The switches 53, 55, 84, and 86 also become the conduction state. The switches 68 and 74 become the non-conduction state, and the non-short-circuit state is established between both the ends of the resistive element 66 and between both the ends of the resistive element 72. Therefore, the gate terminal of the PMOS transistor 106 is pulled up through the resistive element 20B, the PMOS transistor 20A, and the resistive element 66 while the capacitors 54 and 64 are charged, and the gate terminal of the NMOS transistor 110 is pulled down through the resistive element 30B, the PMOS transistor 30A, and the resistive element 72 while the capacitors 56 and 70 are charged.

Accordingly, the gate terminal of the PMOS transistor 106 is more slowly pulled up through the processing in Step 304C compared with the case in which the gate terminal of the PMOS transistor 106 is pulled up through the processing in Step 302C. The gate terminal of the NMOS transistor 110 is more slowly pulled down through the processing in Step 304C compared with the case in which the gate terminal of the NMOS transistor 110 is pulled down through the processing in Step 302C.

In the amplifier 80, because the capacitors 54, 56, 64, and 70 are put into the non-charging state by the first emergency power-down control, the time necessary to pull up and pull down the PMOS transistor 106 and NMOS transistor 110 can be shortened compared with the amplifier 60 of the fourth embodiment that does not include the switches 84 and 86. At the same time, because the capacitors 64 and 70 are put into the charging state by the second emergency power-down control, the PMOS transistor 106 and the NMOS transistor 110 can be pulled up and pulled down for a time corresponding to the pull-up and pull-down times of the PMOS transistor 106 and the NMOS transistor 110 necessary for the amplifier 60 of the fourth embodiment that does not include the switches 84 and 86.

In the fifth embodiment, the capacitors 64 and 70 are put into the non-charging state by the first emergency power-down control. However, the switches 84 and 86 may always be put into the non-conduction state in the case in which the PMOS transistor 106 and the NMOS transistor 110 are pulled up and pulled down by the same circuit configuration as the fourth embodiment.

In the fifth embodiment, the case in which the overcurrent is equal to or higher than the first current value and lower than the second current value differs from the case in which the overcurrent is equal to or higher than the second current value in the time necessary for the PMOS transistor 106 and the NMOS transistor 110 to transition from the conduction state to the non-conduction state. Alternatively, for example, the case in which the overcurrent is equal to or higher than the first current value and lower than the second current value, the case in which the overcurrent is equal to or higher than the second current value and lower than the third current value, the case in which the overcurrent is equal to or higher than the third current value and lower than a fourth current value, and the case in which the overcurrent is equal to or higher than the fourth current value may differ from one another in the time necessary for the PMOS transistor 106 and the NMOS transistor 110 to transition from the conduction state to the non-conduction state. Specifically, the controller 16 may perform control such that the switches 53, 55, 84, and 86 are put in to the non-conduction state while the switches 68 and 74 are put into the conduction state when the overcurrent is equal to or higher than the first current value and lower than the second current value, such that the switches 53 and 55 are put in to the conduction state, the switches 84 and 86 are put into the non-conduction state, and the switches 68 and 74 are put into the conduction state when the overcurrent is equal to or higher than the second current value and lower than the third current value, such that the switches 53, 55, 84, and 86 are put in to the conduction state while the switches 68 and 74 are put into the conduction state when the overcurrent is equal to or higher than the third current value and lower than the fourth current value, and such that the switches 53, 55, 68, 74, 84, and 86 are put into the conduction state when the overcurrent is equal to or higher than the fourth current value. In this case, one kind of the semiconductor integrated circuit can select the charging time suitable to the usage environment or the charging time suitable to the magnitude of the overcurrent. Thus, each switch is controlled such that the number of capacitors in the charging state is increased with increasing overcurrent, which allows the time necessary to pull up and pull down the PMOS transistor 106 and the NMOS transistor 110 to be delayed in the multistep manner.

In the fifth embodiment, by way of example, the gate terminal and the source terminal of the PMOS transistor 106 are connected by the capacitors 54 and 64 that are parallel-connected, and the gate terminal and the source terminal of the NMOS transistor 110 are connected by the capacitors 56 and 70 that are parallel-connected. Alternatively, the gate terminal and the source terminal of the PMOS transistor 106 may be connected by three or more parallel-connected capacitors while the gate terminal and the source terminal of the NMOS transistor 110 may be connected by three or more parallel-connected capacitors. In this case, preferably a switch, which switches between the charging state and the non-charging state of each capacitor and which can switch between the conduction state and the non-conduction state by the controller 16, is provided similarly to the case in which the switches 84 and 86 are provided with respect to the capacitors 64 and 70, respectively, which allows the time necessary to pull up and pull down the PMOS transistor 106 and the NMOS transistor 110 to be delayed in the multistep manner.

In the fifth embodiment, the PMOS transistor 22 and the NMOS transistor 32 are used by way of example. However, the invention can be implemented with no use of the PMOS transistor 22 and the NMOS transistor 32. In this case, in the processing in Step 204 of the power-down processing program of the fifth embodiment, it is not necessary to apply the on-voltages to the gate terminals of the PMOS transistor 22 and the NMOS transistor 32, so that the processing load on the controller 16 can be reduced. Although the invention can be implemented with no use of the switches 53, 55, 84, and 86, preferably the switches 53, 55, 84, and 86 are used when the switching response speeds of the PMOS transistor 106 and the NMOS transistor 110 are changed in the multistep manner according to the current. For example, the switches 53, 55, 84, and 86 are put into the non-conduction state when the power-down is performed at the normal time, and the switches 53, 55, 84, and 86 are put into the conduction state when the overcurrent is generated.

In the embodiments, the controller 16 monitors the measurement result of the ammeter 14, and the controller 16 performs control to switch between the conduction state and the non-conduction state of each MOS transistor (the PMOS transistors 20A and 22 and the NMOS transistors 30A and 32) and each switch (the switches 68, 64, 74, 86) when determining that the overcurrent is passed through based on the measurement result. Alternatively, a user monitors the measurement result of the ammeter 14, and the user may switch between the conduction state and the non-conduction state of each MOS transistor and each switch through the controller 16 or another switching circuit when recognizing that the overcurrent is generated.

Figure 11:
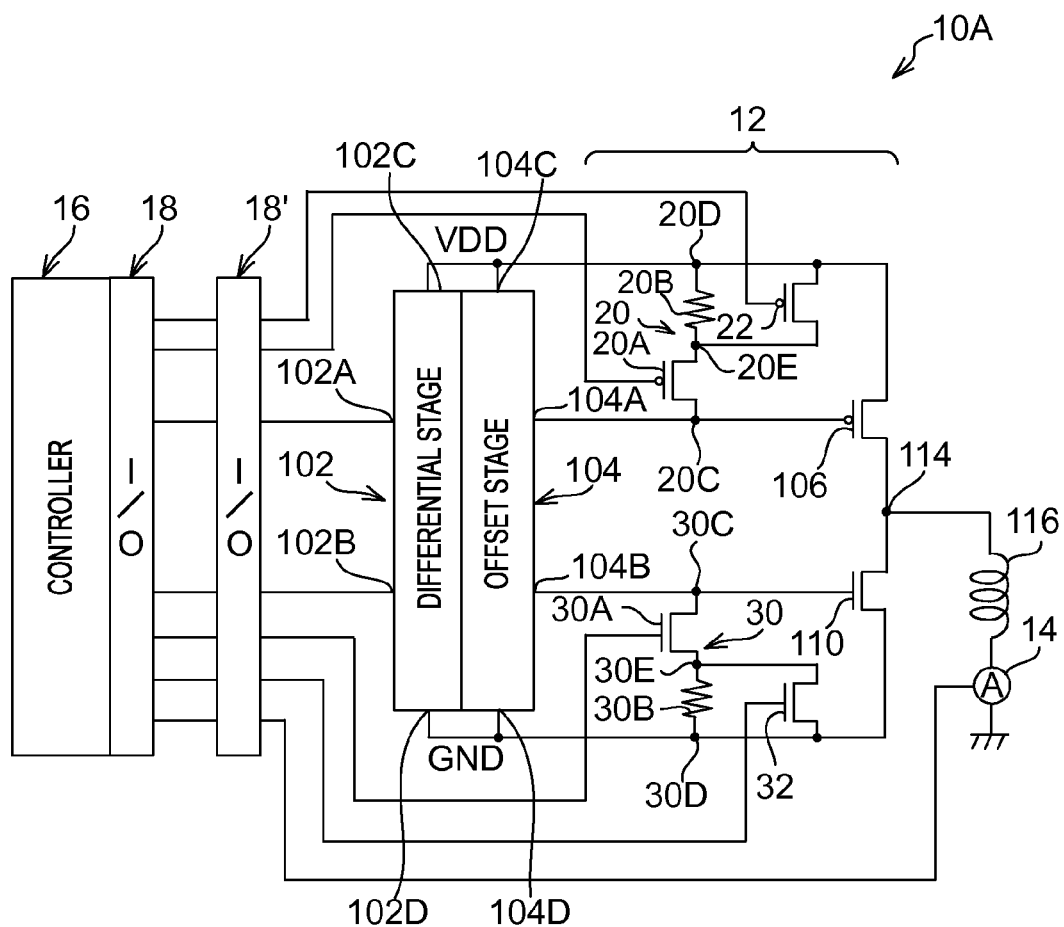
FIG. 11 is a view illustrating a modification of the configuration for controlling the amplifiers of the embodiments.

In the second to fifth embodiments, in order to avoid the confusion, the amplifiers 10, 50, 60, and 80 are controlled by a device except the IC by way of example. Alternatively, for example, an amplifier 10A illustrated in FIG. 11 may be used. The amplifier 10A differs from the amplifier 10 of FIG. 3 in that the controller 16 and the I/O 18 are mounted on a different IC and that an I/O 18' is provided between the I/O 18 and the amplifier 10A. That is, the amplifier 10A is connected to the controller 16 and the I/O 18, which are mounted on the different IC, through the I/O 18'.

Figure 12:
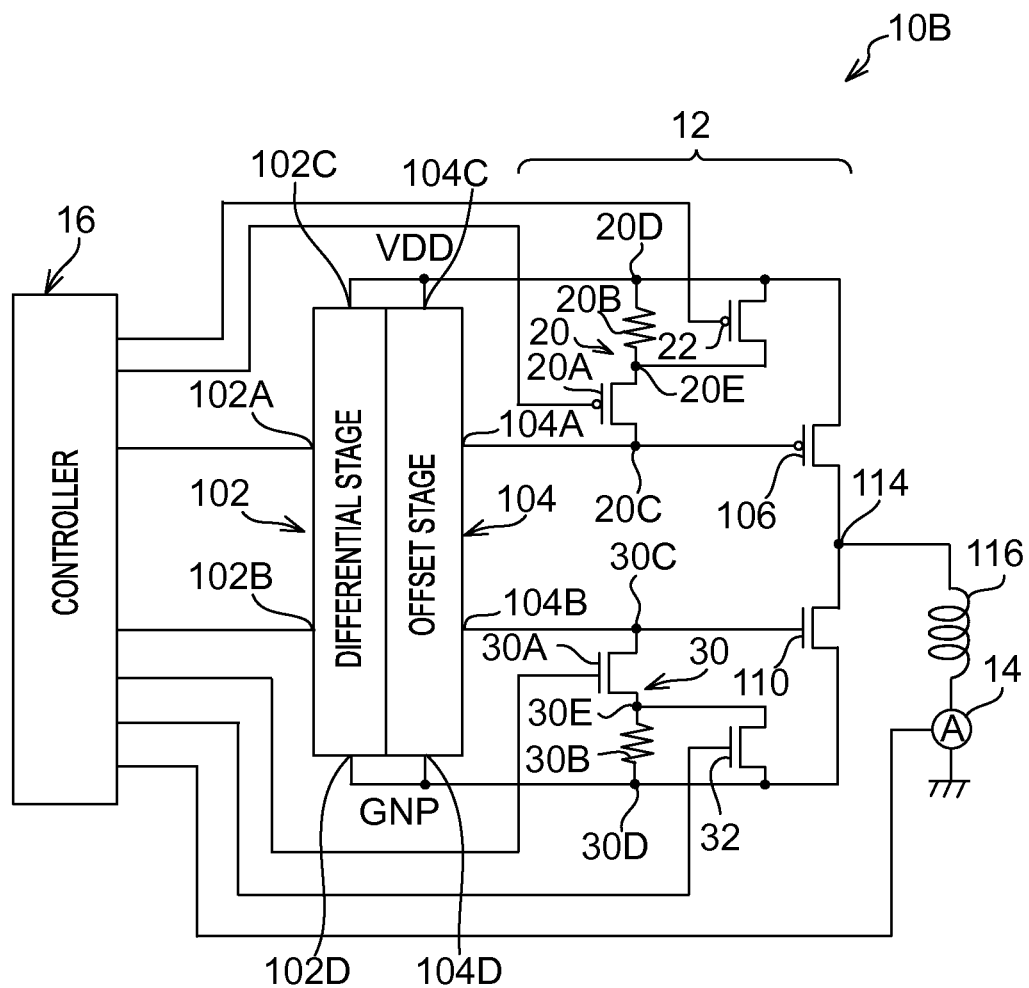
FIG. 12 is a view illustrating a modification of the configuration for controlling the amplifiers of the embodiments.

An amplifier 10B illustrated in FIG. 12 can be cited as another example. The amplifier 10B is formed on the same IC as the controller 16, and the amplifier 10B differs from the amplifier 10 of FIG. 3 in that the I/O 18 is removed.

In the embodiments, by way of example, the coil 116 having the inductor component of 500 nH is connected to the output terminal 114. Alternatively, for example, a semiconductor device having a parasitic inductor component equal to the coil 116 or a cable connected to the speaker may be used, and any inductor unit may be used as long as the inductor unit has the inductor component in which the latch-up of the PMOS transistor 106 and the NMOS transistor 110 is generated by the surge current caused by electromagnetic induction that is created by instantaneously cutting off the overcurrent passed through the amplifier.

In the embodiments, by way of example, the PMOS transistor 106 and the NMOS transistor 110, which are of the protection-target switching elements, are pulled up and pulled down with the resistive element. Alternatively, the on-resistance of the MOS transistor may be utilized instead of the resistive element.

In the embodiments, by way of example, the invention is applied to the amplifier connected to the speaker. Alternatively, the invention may be applied to a regulator circuit, and the invention may be applied to any circuit including the protection-target switching element in which the latch-up caused by the generation of the negative surge current is prevented.

In the embodiments, the MOS transistor is used by way of example. Alternatively, a bipolar transistor may be used. In this case, the bipolar transistor may be used instead of the MOS transistor such that a collector terminal of the bipolar transistor corresponds to the drain of the MOS transistor, such that an emitter terminal of the bipolar transistor corresponds to the source terminal of the MOS transistor, and such that a base terminal of the bipolar transistor corresponds to the gate terminal of the MOS transistor.

In the embodiments, by way of example, the power-down processing program is previously stored in the ROM. Alternatively, the power-down processing program may be provided while stored in a storage medium, such as a CD-ROM, a DVD-ROM, and a USB (Universal Serial Bus) memory, which is read by a computer, or the power-down processing program may be distributed through a wired or wireless communication unit.

Embodiments of the present invention are described above, but the present invention is not limited to the embodiments as will be clear to those skilled in the art.

What is claimed is:

1. A protection device for protecting a protection-target switching element that includes a first terminal, a second terminal and a control terminal, the first terminal being connected to a first voltage line to which a first voltage is applied, the second terminal being connected to a second voltage line, to which a second voltage different from the first voltage is applied, and to an inductor having an inductor component, and the control terminal being applied with an off-voltage that changes a state between the first and second terminals, which are in a conduction state at a normal time, to a non-conduction state, the protection device comprising:

a serial element unit that includes a switching element and a resistor series-connected to the switching element, the switching element being switchable from a non-conduction state to a conduction state according to a first control signal, one end of the serial element unit, which is connected to the control terminal of the protection-target switching element, being one end of the switching element or one end of the resistor, and the other end of the serial element unit, which is connected to the first voltage line, correspondingly being one end of the resistor or one end of the switching element;

a capacitive load having a capacitance value that delays a transition of the protection-target switching element from the conduction state to the non-conduction state to thereby prevent a latch-up; and a controller that includes a first output terminal, which outputs, to the control terminal, the off-voltage that puts the protection-target switching element in the non-conduction state, and a second output terminal, which outputs the first signal that puts the switching element in the conduction state if an overcurrent flows through the protection-target switching element.

2. The protection device according to claim 1, further comprising a short-circuit/non-short-circuit switching unit that is connected between the serial element unit and the control terminal through another resistor, to switch between a short-circuit state in which a short circuit occurs between both ends of the another resistor and a non-short-circuit state in which the short circuit does not occur between the both ends, according to a second control signal, wherein the controller further includes a third output terminal that outputs the second control signal, wherein the controller further outputs the first control signal that puts the switching element in the conduction state and outputs, to the short-circuit/non-short-circuit switching unit, the second control signal that forms the short-circuit state between the both ends of the another resistor, if the controller outputs the off-voltage to the control terminal of the protection-target switching element when a current having a current value equal to or higher than a first current value and lower than a second current value is passed through the protection-target switching element, and wherein the controller further outputs the first signal that puts the switching element in the conduction state and outputs, to the short-circuit/non-short-circuit switching unit, the second control signal that forms the non-short-circuit state between the both ends of the another resistor, if the controller outputs the off-voltage to the control terminal of the protection-target switching element when a current having a current value equal to or higher than the second current value is passed through the protection-target switching element.

3. The protection device according to claim 1, further comprising a charging permission/prohibition switching unit that is configured to switch between a charging state in which the capacitive load is charged and a non-charging state in which the capacitive load is not charged, according to the second control signal, wherein the controller further includes a third output terminal that outputs the second control signal, wherein the controller further outputs the first control signal that puts the switching element in the conduction state and outputs, to the charging permission/prohibition switching unit, the second control signal that puts the capacitive load in the non-charging state, if the controller outputs the off-voltage to the control terminal of the protection-target switching element when a current having a current value equal to or higher than a first current value and lower than a second current value is passed through the protection-target switching element, and wherein the controller further outputs the first signal that puts the switching element in the conduction state and outputs, to the charging permission/prohibition switching unit, the second control signal which puts the capacitive load in the charging state, if the controller outputs the off-voltage to the control terminal of the protection-target switching element when a current having a current value equal to or higher than the second current value is passed through the protection-target switching element.

4. The protection device according to claim 1, further comprising:

another capacitive load that is parallel-connected to the capacitive load; and a charging permission/prohibition switching unit that is provided at the another capacitive load and is configured to switch the another capacitive load between a charging state in which the another capacitive load is charged and a non-charging state in which the another capacitive load is not charged, according to a second control signal, wherein the controller further includes a third output terminal that outputs the second control signal, and wherein the controller further outputs the first control signal that puts the switching element in the conduction state and outputs, to the charging permission/prohibition switching unit, the second control signal that switches the another capacitive load to the charging state according to an increase in current, if the controller outputs the off-voltage to the control terminal of the protection-target switching element when the current is passed through the protection-target switching element.

5. A complementary protection device for protecting a first protection-target switching element that is the protection-target switching element of claim 1, and a second protection-target switching element that includes a first terminal, a second terminal and a control terminal, the first terminal of the second protection-target switching element being connected to the second voltage line, the second terminal of the second protection-target switching element being connected to the second terminal of the first protection-target switching element and to the inductor, and the second protection-target switching element being configured to switch a state between the first and second terminals of the second protection-target switching element, which is a conduction state at a normal time, to a non-conduction state when another off-voltage is applied to the control terminal of the second protection-target switching element, the complementary protection device comprising:

the protection device according to claim 1;

another serial element unit that includes another switching element and another resistor series-connected to the another switching element, the another switching element being switchable from a non-conduction state to a conduction state according to a second control signal, one end of the another serial element unit, which is connected to the control terminal of the second protection-target switching element, being one end of the another switching element or one end of the another resistor, and the other end of the another serial element unit, which is connected to the second voltage line, correspondingly being one end of the another resistor or one end of the another switching element; and another capacitive load that has another predetermined capacitance value that delays a transition of the second protection-target switching element from the conduction state to the non-conduction state to thereby prevent a latch-up, one end of the another capacitive load being connected to the control terminal of the second protection-target switching element, and the other end of the another capacitive load being connected to the second voltage line, wherein the controller further includes a third output terminal that outputs, to the second protection-target switching element, the another off-voltage that puts the second protection-target switching element in the non-conduction state, and a fourth output terminal that outputs, to the second protection-target switching element, the second control signal that puts the another switching element in the conduction state.

6. The complementary protection device according to claim 5, further comprising a short-circuit/non-short-circuit switching unit that is connected between the another serial element unit and the control terminal of the second protection-target switching element through a third resistor, to switch between a short-circuit state in which a short circuit occurs between both ends of the third resistor and a non-short-circuit state in which the short circuit does not occur between the both ends, according to a third control signal,
wherein the controller further includes a fifth output terminal that outputs the third control signal,
wherein the controller further outputs the second control signal that puts the another switching element in the conduction state and outputs, to the short-circuit/non-short-circuit switching unit, the third control signal that puts the third resistor in the short-circuit state, if the controller outputs the another off-voltage to the control terminal of the second protection-target switching element when a current having a current value equal to or higher than a first current value and lower than a second current value is passed through the second protection-target switching element, and
wherein the controller further outputs the second control signal that puts the another switching element in the conduction state and outputs, to the short-circuit/non-short-circuit switching unit, the third control signal that puts the third resistor in the non-short-circuit state, if the controller outputs the another off-voltage to the control terminal of the second protection-target switching element when a current having a current value equal to or higher than the second current value is passed through the second protection-target switching element.

7. The complementary protection device according to claim 5, further comprising a charging permission/prohibition switching unit that is configured to switch between a charging state in which the another capacitive load is charged and a non-charging state in which the another capacitive load is not charged, according to a third control signal,
wherein the controller further includes a fifth output terminal that outputs the third control signal,
wherein the controller further outputs the second control signal that puts the another switching element in the conduction state and outputs, to the charging permission/prohibition switching unit, the third control signal that puts the another capacitive load in the non-charging state, if the controller outputs the another off-voltage to the control terminal of the second protection-target switching element when a current having a current value equal to or higher than a first current value and lower than a second current value is passed through the second protection-target switching element, and
wherein the controller further outputs, to the charging permission/prohibition switching unit, the third control signal that puts the another capacitive load in the charging state, if the controller outputs the another off-voltage to the control terminal of the second protection-target switching element when a current having a current value equal to or higher than the second current value is passed through the second protection-target switching element.

8. The complementary protection device according to claim 5, further comprising:
a third capacitive load that is parallel-connected to the another capacitance; and
a charging permission/prohibition switching unit that is configured to switch the third capacitive load between the charging state and the non-charging state according to a third control signal,
wherein the controller further includes a fifth output terminal that outputs the third control signal, and
wherein the controller further outputs the second control signal that puts the another switching element in the conduction state and outputs, to the charging permission/prohibition switching unit, the third control signal that switches the third capacitive load to the charging state according to an increase in current, if the controller outputs the another off-voltage to the second target-protection switching element when the current is passed through the second protection-target switching element.

9. A signal output device comprising:
the complementary protection device according to claim 5;
a voltage applying unit that is configured to apply a voltage to the control terminals of the first and second protection-target switching elements to respectively drive the first and second protection-target switching elements; and
a signal output unit that outputs a signal corresponding to the voltage, applied by the voltage applying unit, through the inductor.

10. A protection device for protecting a protection-target switching element that includes a first terminal, a second terminal and a control terminal, the first terminal being connected to a first voltage line to which a first voltage is applied, the second terminal being connected to a second voltage line to which a second voltage different from the first voltage is applied and to an inductor having a inductor component, the control terminal being applied with an off-voltage that changes a state of the protection-target switching element between the first and second terminals, which is in a conduction state at a normal time, to a non-conduction state the protection device comprising:
a serial element unit that includes a first switching element and a resistor series-connected to the first switching element, the first switching element being switcheable from a non-conduction state to a conduction state according to a first control signal, one end of the serial element unit, which is connected to the control terminal of the protection-target switching element, being one end of the switching element or one end of the resistor, and the other end of the serial element unit, which is connected to the first voltage line, correspondingly being one end of the resistor or one end of the switching element;
a second switching element that is in a non-conduction state at the normal time and that switches from the non-conduction state to a conduction state according to a second control signal, one end of the second switching element being connected to a connection portion of the first switching element and the resistor, and the other end of the second switching element being connected to the first voltage line; and
a controller including a first output terminal that outputs the off-voltage, a second output terminal that outputs the first control signal, and a third output terminal that outputs the second control signal, the controller outputting the first control signal that puts the first switching element in a conduction state and the second control signal that puts the second switching element in a conduction state, if the controller outputting the off-voltage to the control terminal of the protection-target switching element when an overcurrent is not passed through the protection-target switching element, and outputting the first control signal that puts the first switching element in the conduction state and the second control signal that puts the second switching element in the non-conduction state, if the controller outputs the off-voltage to the control terminal of the protection-target switching element when the overcurrent is passed through the protection-target switching element.

11. The protection device according to claim 10, further comprising a short-circuit/non-short-circuit switching unit, which connects the one end of the serial element unit to the control terminal through another resistor, and which is configured to switch between a short-circuit state in which a short circuit occurs between both ends of the another resistor and a non-short-circuit state in which the short circuit does not occur between the both ends, according to a third control signal,
wherein the controller further includes a fourth output terminal that outputs the third control signal,
wherein the controller further outputs, to the short-circuit/non-short-circuit switching unit, the third control signal that forms the short-circuit state between the both ends of the another resistor, if the controller outputs the off-voltage to the control terminal of the protection-target switching element when the overcurrent having a current value equal to or higher than a first current value and lower than a second current value is passed through the protection-target switching element, and
wherein the controller outputs, to the short-circuit/non-short-circuit switching unit, the third control signal that forms the non-short-circuit state between the both ends of the another resistor, if the controller outputs the off-voltage to the control terminal of the protection-target switching element when the overcurrent having a current value equal to or higher than the second current value is passed through the protection-target switching element.

12. The protection device according to claim 10, further comprising:
a capacitive load having a capacitance value that delays a transition of the protection-target switching element from the conduction state to the non-conduction state to thereby prevent a latch-up, one end of the capacitive load being connected to the control terminal, and the other end of the capacitive load being connected to the first voltage line; and
a charging permission/prohibition switching unit that is configured to switch between a charging state in which the capacitive load is charged and a non-charging state in which the capacitive load is not charged, according to a third control signal,
wherein the controller further includes a fourth output terminal that outputs the third control signal,
wherein the controller further outputs, to the charging permission/prohibition switching unit, the third control signal that puts the capacitive load in the non-charging state, if the controller outputs the off-voltage to the control terminal of the protection-target switching terminal when the overcurrent having a current value equal to or higher than a first current value and lower than a second current value is passed through the protection-target switching element, and
wherein the controller further outputs, to the charging permission/prohibition switching unit, the third control signal that puts the capacitive load in the charging state, if the controller outputs the off-voltage to the control terminal of the protection-target switching element when the overcurrent having a current value equal to or higher than the second current value is passed through the protection-target switching element.

13. The protection device according to claim 12, further comprising:
another capacitive load that is parallel-connected to the capacitive load; and
another charging permission/prohibition switching unit that is configured to switch the another capacitive load between a charging state in which the another capacitive load is charged and a non-charging state in which the another capacitive load is not charged, according to a fourth control signal,
wherein the controller further includes a fifth output terminal that outputs the fourth control signal, and
wherein the controller further outputs, to the another charging permission/prohibition switching unit, the fourth control signal that switches the charging state of the another capacitive load according to an increase in the overcurrent, if the controller outputs the off-voltage to the control terminal of the protection-target switching element when the overcurrent is passed through the protection-target switching element.

14. A complementary protection device for protecting a first protection-target switching element that is the protection-target switching element of claim 10, and a second protection-target switching element that includes a first terminal, a second terminal and a control terminal, the first terminal of the second protection-target switching element being connected to the second voltage line, the second terminal of the second protection-target switching element being connected to the second terminal of the first protection-target switching element and to the inductor, and the second protection-target switching element being configured to switch a state between the first and second terminals of the second protection-target switching element, which is a conduction state at a normal time, to a non-conduction state when another off-voltage is applied to the control terminal of the second protection-target switching element, the complementary protection device comprising:
the protection device according to claim 10;
another serial element unit that includes a third switching element and another resistor series-connected to the third switching element, the third switching element being switchable from a non-conduction state to a conduction state according to a third control signal, one end of the another serial element which is connected to the control terminal of the second protection-target switching element, being one of the third switching element or one end of the another resistor, and the other end of the second serial element, which is connected to the second voltage line, correspondingly being one of the another resistor or one end of the third switching element; and
a fourth switching element, one end of which is connected to a connection portion of the third switching element and the another resistor, and the other end of which is connected to the second voltage line, the fourth switching element being in a non-conduction state at a normal time, and the fourth switching element being switchable from the non-conduction state to a conduction state according to a fourth control signal,
wherein the controller further includes a fourth output terminal that outputs the another off-voltage, a fifth output terminal that outputs the third control signal, and a sixth control terminal that outputs the fourth control signal,
wherein the controller further outputs the third control signal that puts the third switching element in the conduction state and the fourth control signal that puts the fourth switching element in the conduction state, if the controller outputs the another off-voltage to the control terminal of the second protection-target switching element when an overcurrent is not passed through the second protection-target switching element, and wherein the controller further outputs the third control signal that puts the third switching element in the conduction state and the fourth control signal that puts the fourth switching element in the non-conduction state, if the controller outputs the another off-voltage to the control terminal of the second protection-target switching element when the overcurrent is passed through the second protection-target switching element.

15. The complementary protection device according to claim 14, further comprising a short-circuit/non-short-circuit switching unit that is connected between the one end of the another serial element unit and the control terminal of the second protection-target switching element through a third resistor, to switch between a short-circuit state in which a short circuit occurs between both ends of the third resistor and a non-short-circuit state in which the short circuit does not occur between the both ends, according to a fifth control signal, wherein the controller further includes a seventh output terminal that outputs the fifth control signal, wherein the controller further outputs, to the short-circuit/non-short-circuit switching unit, the fifth control signal that puts the third resistor in the short-circuit state, if the controller outputs the off-voltage to the control terminal of the second protection-target switching element when the overcurrent having a current value equal to or higher than a first current value and lower than a second current value is passed through the protection-target switching element, and wherein the controller further outputs, to the short-circuit/non-short-circuit switching unit, the fifth control signal that puts the third resistor in the non-short-circuit state, if the controller outputs the another off-voltage to the control terminal of the second protection-target switching element when the overcurrent having a current value equal to or higher than the second current value is passed through the second protection-target switching element.

16. The complementary protection device according to claim 14, further comprising:

a capacitive load having a capacitance value that delays a transition of the protection target switching element from the conduction state to the non-conduction state to thereby prevent a latch-up, one end of the capacitive load being connected to the control terminal, and the other end of the capacitive load being connected to the second voltage line; and a charging permission/prohibition switching unit that is configured to switch the capacitive load between a charging state and a non-charging state according to a fifth control signal, wherein the controller further includes a seventh output terminal that outputs the fifth control signal, wherein the controller further outputs, to the charging permission/prohibition switching unit, the fifth control signal that puts the capacitive load in the non-charging state, if the controller outputs the another off-voltage to the control terminal of the second protection-target switching element when the overcurrent having a current value equal to or higher than a first current value and lower than a second current value is passed through the second protection-target switching element, and the controller further outputs, to the charging permission/prohibition switching unit, the fifth control signal that puts the capacitive load in the charging state, if the controller outputs the another off-voltage to the control terminal of the second protection-target switching element when the overcurrent having a current value equal to or higher than the second current value is passed through the second protection-target switching element.

17. The complementary protection device according to claim 16, further comprising:

another capacitive load that is parallel-connected to the capacitive load; and a charging permission/prohibition switching unit that is configured to switch the another capacitive load between a charging state and a non-charging state according to a sixth control signal, wherein the controller further includes a eighth output terminal that outputs the sixth control signal, and wherein the controller further outputs, to the charging permission/prohibition switching unit, the sixth control signal that puts the another capacitive load in the charging state according to an increase in overcurrent, if the controller outputs the another off-voltage to the control terminal of the second protection-target switching element when the overcurrent is passed through the second protection-target switching element.

18. The complementary protection device according to claim 14, wherein each switching element in one of a first switching element group including the first protection-target switching element, the first switching element and the second switching element and a second switching element group including the second protection-target switching element, the third switching element and the fourth switching element includes an N-type field effect transistor, and each switching element in the other of the first switching element group and the second switching element group includes a P-type field effect transistor.

* * * * *